United States Patent
Horstman et al.

(10) Patent No.: US 9,076,934 B2
(45) Date of Patent: Jul. 7, 2015

(54) PROCESS FOR PREPARING RESIN-LINEAR ORGANOSILOXANE BLOCK COPOLYMERS

(71) Applicant: Dow Corning Corporation, Midland, MI (US)

(72) Inventors: John Bernard Horstman, Midland, MI (US); Steven Swier, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 14/386,226

(22) PCT Filed: Mar. 12, 2013

(86) PCT No.: PCT/US2013/030396
§ 371 (c)(1),
(2) Date: Sep. 18, 2014

(87) PCT Pub. No.: WO2013/142140
PCT Pub. Date: Sep. 26, 2013

(65) Prior Publication Data
US 2015/0087771 A1    Mar. 26, 2015

Related U.S. Application Data

(60) Provisional application No. 61/613,511, filed on Mar. 21, 2012.

(51) Int. Cl.
| | | |
|---|---|---|
| *C08G 77/44* | (2006.01) | |
| *C08G 77/48* | (2006.01) | |
| *H01L 33/00* | (2010.01) | |
| *H01L 33/56* | (2010.01) | |
| *C08G 77/42* | (2006.01) | |
| *C09D 183/10* | (2006.01) | |

(52) U.S. Cl.
CPC .............. *H01L 33/56* (2013.01); *C08G 77/42* (2013.01); *C09D 183/10* (2013.01)

(58) Field of Classification Search
None
See application file for complete search history.

(56) References Cited

U.S. PATENT DOCUMENTS

| | | | | |
|---|---|---|---|---|
| 3,294,718 A * | 12/1966 | Antonen | .......................... | 528/19 |
| 3,328,481 A * | 6/1967 | Vincent | .......................... | 525/477 |
| 3,576,905 A * | 4/1971 | McKellar et al. | ............... | 528/34 |
| 3,607,972 A * | 9/1971 | Kiles et al. | .................... | 525/477 |
| 3,619,229 A * | 11/1971 | Hartlein | ........................ | 523/209 |
| 3,629,228 A * | 12/1971 | Hartlein et al. | ................. | 528/17 |
| 3,639,155 A * | 2/1972 | Hartlein et al. | ............... | 428/447 |
| 3,647,846 A * | 3/1972 | Hartlein et al. | ............... | 556/436 |
| 3,670,649 A * | 6/1972 | Hartlein et al. | ............... | 102/431 |
| 4,419,402 A * | 12/1983 | Gutek | ............................ | 442/145 |
| 4,443,502 A * | 4/1984 | Gutek | ............................ | 427/387 |
| 6,803,409 B2 * | 10/2004 | Keryk et al. | ................... | 524/837 |
| 7,312,008 B2 * | 12/2007 | Wu et al. | .......................... | 430/66 |
| 2005/0180712 A1 * | 8/2005 | Shelnut et al. | ................. | 385/129 |

FOREIGN PATENT DOCUMENTS

WO    WO-2013/142140 A1    9/2013

OTHER PUBLICATIONS

"International Application Serial No. PCT/US2013/030396, International Search Report mailed Jul. 19, 2013", 5 pgs.
"International Application Serial No. PCT/US2013/030396, Written Opinion mailed Jul. 19, 2013", 8 pgs.

* cited by examiner

*Primary Examiner* — Robert S Loewe
(74) *Attorney, Agent, or Firm* — Schwegman Lundberg & Woessner, P.A.

(57) ABSTRACT

A process is disclosed for preparing a resin-linear organosiloxane block copolymer by reacting a linear organosiloxane and an organosiloxane resin to form a resin-linear organosiloxane block copolymer. The resulting resin-linear organosiloxane block copolymer is then crosslinked to increase the average molecular weight of the resin-linear organosiloxane block copolymer. The resin-linear organosiloxanes block copolymers prepared by the disclosed process may provide solid, optically clear compositions which may be considered as "reprocessable."

22 Claims, No Drawings

PROCESS FOR PREPARING RESIN-LINEAR ORGANOSILOXANE BLOCK COPOLYMERS

CROSS-REFERENCE TO RELATED APPLICATIONS

This application is a U.S. national stage application filed under 35 U.S.C. §371 from International Application Serial No. PCT/US2013/030396, which was filed Mar. 12, 2013, and published as WO 2013/142140 on Sep. 26, 2013, and which claims the benefit of U.S. Provisional Patent Appl. Ser. No. 61/613,511, filed Mar. 21, 2012, which applications and publication are incorporated by reference as if reproduced herein and made a part hereof in their entirety, and the benefit of priority of each of which is claimed herein.

BACKGROUND

Light emitting diodes (LEDs) and solar panels use an encapsulant coating to protect electronic components from environmental factors. Such protective coatings must be optically clear to ensure maximum efficiency of these devices. Furthermore, these protective coatings must be tough, durable, long lasting, and yet easy to apply. Many of the currently available coatings, however, lack toughness; are not durable; are not long-lasting; and/or are not easy to apply. There is therefore a continuing need to identify protective and/or functional coatings in many areas of emerging technologies.

BRIEF SUMMARY OF THE EMBODIMENTS

Embodiment 1 relates to a process for preparing a resin-linear organosiloxane block copolymer comprising:
I) reacting
  a) a linear organosiloxane having the formula

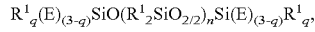

wherein each $R^1$, at each occurrence, is independently a $C_1$ to $C_{30}$ hydrocarbyl,
  n is 10 to 400, q is 0, 1, or 2,
  E is a hydrolyzable group containing at least one carbon atom, and
  b) an organosiloxane resin comprising at least 60 mole % of [$R^2SiO_{3/2}$] siloxy units in its formula, wherein each $R^2$ is independently a $C_1$ to $C_{20}$ hydrocarbyl,
in c) an organic solvent
to form a resin-linear organosiloxane block copolymer;
  wherein the amounts of a) and b) used in step I) are selected to provide the resin-linear organosiloxane block copolymer with 40 to 90 mole % of disiloxy units [$R^1_2SiO_{2/2}$] and 10 to 60 mole % of trisiloxy units [$R^2SiO_{3/2}$], and
  wherein at least 95 weight percent of the linear organosiloxane added in step I) is incorporated into the resin-linear organosiloxane block copolymer,
II) reacting the resin-linear organosiloxane block copolymer from step I) to crosslink the trisiloxy units of the resin-linear organosiloxane block copolymer sufficiently to increase the weight average molecular weight ($M_w$) of the resin-linear organosiloxane block copolymer by at least 50%,
wherein the crosslinking reaction is promoted by a superbase,
III) optionally, further processing the resin-linear organosiloxane block copolymer; and
IV) optionally, removing the organic solvent.

Embodiment 2 relates to a process of Embodiment 1, wherein said further processing comprises further processing to enhance storage stability and/or optical clarity.

Embodiment 3 relates to a process of Embodiment 1, wherein E is acetoxy and q=1.

Embodiment 4 relates to a process of Embodiments 1-3, wherein the resin-linear block copolymer of step I) is further processed.

Embodiment 5 relates to a process of Embodiments 1-4, wherein said further processing comprises removing a by-product of the step I) reaction.

Embodiment 6 relates to a process of Embodiment 5, wherein the by-product comprises acetic acid.

Embodiment 7 relates to a process of Embodiment 1, wherein said crosslinking reaction is catalyzed by a superbase.

Embodiment 8 relates to a process of Embodiments 1-7, wherein the superbase is an organic superbase.

Embodiment 9 relates to a process of Embodiments 1-8, wherein the superbase comprises:
1,8-Diazabicyclo[5.4.0]undec-7-ene (DBU), (CAS #6674-22-2)
1,5,7-Triazabicyclo[4.4.0]dec-5-ene (TBD), (CAS #5807-14-7)
1,4-Diazabicyclo[2.2.2]octane (DABCO), (CAS #280-57-9)
1,1,3,3-Tetramethylguanidine (TMG), (CAS #80-70-6)
1,5-Diazabicyclo[4.3.0]-5-nonene (DBN), (CAS #3001-72-7)
7-Methyl-1,5,7-triazabicyclo[4.4.0]dec-5-ene (MTBD) (CAS #84030-20-6)
or combinations thereof.

Embodiment 10 relates to a process of Embodiments 1-9, wherein the superbase is 1,8-diazabicyclo[5.4.0]undec-7-ene (DBU), (CAS #6674-22-2).

Embodiment 11 relates to a process of Embodiments 1-10, wherein $R^1$ is methyl or phenyl.

Embodiment 12 relates to a process of Embodiments 1-11, wherein $R^2$ is methyl or phenyl.

Embodiment 13 relates to a process of Embodiments 1-12, wherein $R^2$ is phenyl.

Embodiment 14 relates to a process of Embodiments 1-13, wherein instead of or in addition to said further processing, the organosiloxane block copolymer from step II) is contacted with a stabilizer or a superbase.

Embodiment 15 relates to a resin-linear organosiloxane block copolymer prepared according to the process of Embodiments 1-14.

Embodiment 16 relates to the resin-linear organosiloxane block copolymer of Embodiment 15, wherein said resin-linear organosiloxane block copolymer comprises:
  40 to 90 mole percent disiloxy units of the formula [$R^1_2SiO_{2/2}$],
  10 to 60 mole percent trisiloxy units of the formula [$R^2SiO_{3/2}$],
  0.5 to 35 mole percent silanol groups [≡SiOH];
  wherein:
    each $R^1$, at each occurrence, is independently a $C_1$ to $C_{30}$ hydrocarbyl,
    each $R^2$, at each occurrence, is independently a $C_1$ to $C_{20}$ hydrocarbyl;
  wherein:
    the disiloxy units [$R^1_2SiO_{2/2}$] are arranged in linear blocks having an average of from 10 to 400 disiloxy units [$R^1_2SiO_{2/2}$] per linear block, the trisiloxy units [$R^2SiO_{3/2}$] are arranged in non-linear blocks having a molecular weight of at least 500 g/mole, and at least 30% of the non-linear blocks are crosslinked with each other, each linear block is linked to at least one non-linear block; and the organosiloxane block copolymer has a molecular weight of at least 20,000 g/mole.

Embodiment 17 relates to a method of forming a coating comprising applying a film of the resin-linear organosiloxane block copolymer of Embodiment 15 on a surface and curing the film to form a coating.

Embodiment 18 relates to a solid composition comprising the resin-linear organosiloxane of Embodiment 15.

Embodiment 19 relates to the solid composition of Embodiment 18, wherein the solid has an optical transmittance of visible light that is at least 95%.

Embodiment 20 relates to an LED encapsulant comprising the compositions of Embodiments 18-19.

Embodiment 21 relates to a solid composition of Embodiments 18-19, further comprising a super base or a stabilizer.

Embodiment 22 relates to a cured product of the composition of Embodiments 18-19.

DETAILED DESCRIPTION OF THE EMBODIMENTS

The present disclosure provides a process for preparing certain "resin linear" organsiloxane block copolymers, as well as curable and solid compositions comprising "resin linear" organosiloxane block copolymers. An "endcapped" linear organosiloxane and an organosiloxane resin are reacted to form a resin-linear organosiloxane block copolymer, which is subsequently crosslinked in the presence an organic superbase. The resin-linear organosiloxanes block copolymers prepared by the disclosed process may provide optically solid compositions which may be "reprocessable".

i) The Organosiloxane Block Copolymer

The organosiloxane block copolymers comprise:
  40 to 90 mole percent disiloxy units of the formula $[R^1_2SiO_{2/2}]$,
  10 to 60 mole percent trisiloxy units of the formula $[R^2SiO_{3/2}]$,
  0.5 to 35 mole percent silanol groups [≡SiOH];
  wherein:
    each $R^1$, at each occurrence, is independently a $C_1$ to $C_{30}$ hydrocarbyl,
    each $R^2$, at each occurrence, is independently a $C_1$ to $C_{20}$ hydrocarbyl;
  wherein:
    the disiloxy units 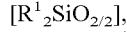 are arranged in linear blocks having an average of from 10 to 400 disiloxy units 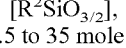 per linear block, the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block; and
    the organosiloxane block copolymer has a molecular weight of at least 20,000 g/mole.

Organopolysiloxanes are polymers containing siloxy units independently selected from $[R_3SiO_{1/2}]$, $[R_2SiO_{2/2}]$, $[RSiO_{3/2}]$, or $[SiO_{4/2}]$ siloxy units, where R may be, e.g., any organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. For example, "linear" organopolysiloxanes contain, in some embodiments, mostly D, or $[R_2SiO_{2/2}]$ siloxy units, which results in polydiorganosiloxanes that are fluids of varying viscosities, depending on the "degree of polymerization" or "dp" as indicated by the number of D units in the polydiorganosiloxane. "Linear" organopolysiloxanes, in some embodiments, have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "resin" or a "silsesquioxane resin." Increasing the amount of T or Q siloxy units in an organopolysiloxane, in some embodiments, results in polymers having increasing hardness and/or glass like properties. "Resin" organopolysiloxanes thus have higher $T_g$ values, for example siloxane resins often have $T_g$ values greater than 40° C., e.g., greater than 50° C., greater than 60° C., greater than 70° C., greater than 80° C., greater than 90° C. or greater than 100° C. In some embodiments, $T_g$ for siloxane resins is from about 60° C. to about 100° C., e.g., from about 60° C. to about 80° C., from about 50° C. to about 100° C., from about 50° C. to about 80° C. or from about 70° C. to about 100° C.

As used herein "organosiloxane block copolymers" or "resin-linear organosiloxane block copolymers" refer to organopolysiloxanes containing "linear" D siloxy units in combination with "resin" T siloxy units. In some embodiments, the organosiloxane copolymers are "block" copolymers, as opposed to "random" copolymers. As such, the "resin-linear organosiloxane block copolymers" of the disclosed embodiments refer to organopolysiloxanes containing D and T siloxy units, where the D units (i.e., $[R^1_2SiO_{2/2}]$ units) are primarily bonded together to form polymeric chains having, in some embodiments, an average of from 10 to 400 D units (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), which are referred herein as "linear blocks."

The T units (i.e., $[R^2SiO_{3/2}]$) are, in some embodiments, primarily bonded to each other to form branched polymeric chains, which are referred to as "non-linear blocks." In some embodiments, a significant number of these non-linear blocks may further aggregate to form "nano-domains" when solid forms of the block copolymer are provided. In some embodiments, these nano-domains form a phase separate from a phase formed from linear blocks having D units, such that a resin-rich phase forms. In some embodiments, the disiloxy units $[R^1_2SiO_{2/2}]$ are arranged in linear blocks having an average of from 10 to 400 disiloxy units $[R^1_2SiO_{2/2}]$ per linear block (e.g., an average of from about 10 to about 350 D units; about 10 to about 300 D units; about 10 to about 200 D units; about 10 to about 100 D units; about 50 to about 400 D units; about 100 to about 400 D units; about 150 to about 400 D units; about 200 to about 400 D units; about 300 to about 400 D units; about 50 to about 300 D units; about 100 to about 300 D units; about 150 to about 300 D units; about 200 to about 300 D units; about 100 to about 150 D units, about 115 to about 125 D units, about 90 to about 170 D units or about 110 to about 140 D units), and the trisiloxy units $[R^2SiO_{3/2}]$ are arranged in non-linear blocks having a molecular weight of at least 500 g/mole and at least 30% of the non-linear blocks are crosslinked with each other.

In some embodiments, the non-linear blocks have a number average molecular weight of at least 500 g/mole, e.g., at least 1000 g/mole, at least 2000 g/mole, at least 3000 g/mole or at least 4000 g/mole; or have a molecular weight of from about 500 g/mole to about 4000 g/mole, from about 500 g/mole to about 3000 g/mole, from about 500 g/mole to about 2000 g/mole, from about 500 g/mole to about 1000 g/mole, from about 1000 g/mole to 2000 g/mole, from about 1000 g/mole to about 1500 g/mole, from about 1000 g/mole to about 1200 g/mole, from about 1000 g/mole to 3000 g/mole, from about 1000 g/mole to about 2500 g/mole, from about 1000 g/mole to about 4000 g/mole, from about 2000 g/mole to about 3000 g/mole or from about 2000 g/mole to about 4000 g/mole.

In some embodiments, at least 30% of the non-linear blocks are crosslinked with each other, e.g., at least 40% of the non-linear blocks are crosslinked with each other; at least 50% of the non-linear blocks are crosslinked with each other; at least 60% of the non-linear blocks are crosslinked with each other; at least 70% of the non-linear blocks are crosslinked with each other; or at least 80% of the non-linear blocks are crosslinked with each other, wherein all of the percentages given herein to indicate percent non-linear blocks that are crosslinked are in weight percent. In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 55% to about 70% of the non-linear blocks are crosslinked with each other, from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The organosiloxane block copolymers (e.g., those comprising 40 to 90 mole percent disiloxy units of the formula $[R^1{}_2SiO_{2/2}]$ and 10 to 60 mole percent trisiloxy units of the formula $[R^2SiO_{3/2}]$) may be represented by the formula $[R^1{}_2SiO_{2/2}]_a[R^2SiO_{3/2}]_b$ where the subscripts a and b represent the mole fractions of the siloxy units in the copolymer, a is about 0.4 to about 0.9,
   alternatively about 0.5 to about 0.9,
   alternatively about 0.6 to about 0.9,
b may vary from 0.1 to 0.6,
   alternatively about 0.1 to about 0.5,
   alternatively about 0.1 to about 0.4,
wherein each $R^1$, at each occurrence, is independently a $C_1$ to $C_{30}$ hydrocarbyl, and
each $R^2$, at each occurrence, is independently a $C_1$ to $C_{10}$ hydrocarbyl.

In some embodiments, the organosiloxane block copolymers of the embodiments described herein comprise 40 to 90 mole percent disiloxy units of the formula $[R^1{}_2SiO_{2/2}]$, e.g., 50 to 90 mole percent disiloxy units of the formula $[R^1{}_2SiO_{2/2}]$; 60 to 90 mole percent disiloxy units of the formula $[R^1{}_2SiO_{2/2}]$; 65 to 90 mole percent disiloxy units of the formula $[R^1{}_2SiO_{2/2}]$; 70 to 90 mole percent disiloxy units of the formula $[R^1{}_2SiO_{2/2}]$; or 80 to 90 mole percent disiloxy units of the formula $[R^1{}_2SiO_{2/2}]$; 40 to 80 mole percent disiloxy units of the formula $[R^1{}_2SiO_{2/2}]$; 40 to 70 mole percent disiloxy units of the formula $[R^1{}_2SiO_{2/2}]$; 40 to 60 mole percent disiloxy units of the formula $[R^1{}_2SiO_{2/2}]$; 40 to 50 mole percent disiloxy units of the formula $[R^1{}_2SiO_{2/2}]$; 50 to 80 mole percent disiloxy units of the formula $[R^1{}_2SiO_{2/2}]$; 50 to 70 mole percent disiloxy units of the formula $[R^1{}_2SiO_{2/2}]$; 50 to 60 mole percent disiloxy units of the formula $[R^1{}_2SiO_{2/2}]$; 60 to 80 mole percent disiloxy units of the formula $[R^1{}_2SiO_{2/2}]$; 60 to 70 mole percent disiloxy units of the formula $[R^1{}_2SiO_{2/2}]$; or 70 to 80 mole percent disiloxy units of the formula $[R^1{}_2SiO_{2/2}]$.

In some embodiments, the organosiloxane block copolymers of the embodiments described herein comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

It should be understood that the organosiloxane block copolymers of the embodiments described herein may contain additional siloxy units, such as M siloxy units, Q siloxy units, other unique D or T siloxy units (for example, having organic groups other than $R^1$ or $R^2$), provided that the organosiloxane block copolymer contains the mole fractions of the disiloxy and trisiloxy units as described herein. In other words, the sum of the mole fractions as designated by subscripts a and b, do not necessarily have to sum to one. The sum of a+b may be less than one to account for minor amounts of other siloxy units that may be present in the organosiloxane block copolymer. Alternatively, the sum of a+b is greater than 0.6, alternatively greater than 0.7, alternatively greater than 0.8, or alternatively greater than 0.9. In some embodiments, the sum of a+b is from about 0.6 to about 0.9, e.g., from about 0.6 to about 0.8, from about 0.6 to about 0.7, from about 0.7 to about 0.9, from about 0.7 to about 0.8, or from about 0.8 to about 0.9.

In one embodiment, the organosiloxane block copolymer consists essentially of the disiloxy units of the formula $[R^1{}_2SiO_{2/2}]$ and trisiloxy units of the formula $[R^2SiO_{3/2}]$, while also containing 0.5 to 25 mole percent silanol groups [≡SiOH] (e.g., 0.5 to 5 mole percent, 0.5 to 10 mole percent, 0.5 to 15 mole percent, 0.5 to 20 mole percent, 5 to 10 mole percent, 5 to 15 mole percent, 5 to 20 mole percent, 5 to 25 mole percent, 10 to 15 mole percent 10 to 20 mole percent, 10 to 25 mole percent, 15 to 20 mole percent, 15 to 25 mole percent, or to 25 mole percent), where $R^1$ and $R^2$ are as defined herein. Thus, in some embodiments, the sum of a+b (when using mole fractions to represent the amount of disiloxy and trisiloxy units in the copolymer) is greater than 0.95, alternatively greater than 0.98.

In some embodiments, the resin-linear organosiloxane block copolymers also contain silanol groups (SiOH). The amount of silanol groups present on the organosiloxane block copolymer may vary from 0.5 to 35 mole percent silanol groups [≡SiOH], alternatively from 2 to 32 mole percent silanol groups [≡SiOH], alternatively from 8 to 22 mole percent silanol groups [≡SiOH].

The silanol groups may be present on any siloxy units within the organosiloxane block copolymer. The amount described herein represent the total amount of silanol groups found in the organosiloxane block copolymer. In some embodiments, the majority (e.g., greater than 75%, greater than 80%, greater than 90%; from about 75% to about 90%, from about 80% to about 90%, or from about 75% to about 85%) of the silanol groups will reside on the trisiloxy units, i.e., the resin component of the block copolymer. Although not wishing to be bound by any theory, the silanol groups present on the resin component of the organosiloxane block copolymer allows for the block copolymer to further react or cure at elevated temperatures.

At each occurrence, each $R^1$ in the above disiloxy unit is independently a $C_1$ to $C_{30}$ hydrocarbyl, where the hydrocarbyl group may independently be an alkyl, aryl, or alkylaryl group. Each $R^1$, at each occurrence, may independently be a $C_1$ to $C_{30}$ alkyl group, alternatively each $R^1$, at each occurrence, may independently be a $C_1$ to $C_{18}$ alkyl group. Alternatively, at each occurrence, each $R^1$ may independently be a $C_1$ to $C_6$ alkyl group such as methyl, ethyl, propyl, butyl, pentyl, or hexyl. Alternatively, at each occurrence, each $R^1$ may independently be methyl. Each $R^1$, at each occurrence, may independently be an aryl group, such as phenyl, naphthyl or an anthryl group. Alternatively, at each occurrence, each $R^1$ may independently be any combination of the aforementioned alkyl or aryl groups. Alternatively, at each occurrence, each $R^1$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

At each occurrence, each $R^2$ in the above trisiloxy unit is independently a $C_1$ to $C_{20}$ hydrocarbyl (e.g., $C_1$ to $C_{10}$ hydrocarbyl), where the hydrocarbyl group may independently be an alkyl, aryl, or alkylaryl group. Each $R^2$, at each occurrence, may independently be a $C_1$ to $C_{20}$ (e.g., $C_1$ to $C_{10}$ hydrocarbyl) alkyl group, alternatively each $R^2$, at each occurrence, may independently be a $C_1$ to $C_8$ alkyl group. Alternatively, at each occurrence, each $R^2$ may independently be a $C_1$ to $C_6$ alkyl group such as methyl, ethyl, propyl, butyl, pentyl, or hexyl. Alternatively, at each occurrence, each $R^2$ may independently be methyl. Each $R^2$, at each occurrence, may independently be an aryl group, such as phenyl, naphthyl or an anthryl group. Alternatively, at each occurrence, each $R^2$ may independently be any combination of the aforementioned alkyl or aryl groups. Alternatively, at each occurrence, each $R^2$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

As used herein, hydrocarbyl also includes substituted hydrocarbyls. "Substituted" as used herein refers broadly to replacement of one or more of the hydrogen atoms of the group with substituents known to those skilled in the art and resulting in a stable compound as described herein. Examples of suitable substituents include, but are not limited to, alkyl, alkenyl, alkynyl, cycloalkyl, aryl, alkaryl, hydroxy, alkoxy, aryloxy, carboxy (i.e., $CO_2H$), carboxyalkyl, carboxyaryl, cyano, nitro and the like. Substituted hydrocabyl also includes halogen substituted hydrocarbyls, where the halogen may be fluorine, chlorine, bromine or combinations thereof.

In some embodiments, fluorinated organosiloxane block copolymer can also be prepared via the process described herein, such that the resulting fluorinated organosiloxane block copolymers are the same as those described in U.S. Provisional Patent Appl. Ser. No. 61/608,732, filed Mar. 9, 2012; and PCT Appl. No. PCT/US2013/027904, filed Feb. 27, 2013, the entire disclosures of both of which are incorporated by reference as if fully set forth herein.

The formula $[R^1{}_2SiO_{2/2}]_a[R^2SiO_{3/2}]_b$, and related formulae using mole fractions, as used herein to describe the organosiloxane block copolymers, does not indicate structural ordering of the disiloxy $[R^1{}_2SiO_{2/2}]$ and trisiloxy $[R^2SiO_{3/2}]$ units in the copolymer. Rather, this formula is meant to provide a convenient notation to describe the relative amounts of the two units in the copolymer, as per the mole fractions described herein via the subscripts a and b. The mole fractions of the various siloxy units in the present organosiloxane block copolymers, as well as the silanol content, may be readily determined by $^{29}Si$ NMR techniques.

The organosiloxane block copolymers of the embodiments described herein have a weight average molecular weight ($M_w$) of at least 20,000 g/mole, alternatively a weight average molecular weight of at least 40,000 g/mole, alternatively a weight average molecular weight of at least 50,000 g/mole, alternatively a weight average molecular weight of at least 60,000 g/mole, alternatively a weight average molecular weight of at least 70,000 g/mole, or alternatively a weight average molecular weight of at least 80,000 g/mole. In some embodiments, the organosiloxane block copolymers of the embodiments described herein have a weight average molecular weight ($M_w$) of from about 20,000 g/mole to about 250,000 g/mole or from about 100,000 g/mole to about 250,000 g/mole, alternatively a weight average molecular weight of from about 40,000 g/mole to about 100,000 g/mole, alternatively a weight average molecular weight of from about 50,000 g/mole to about 100,000 g/mole, alternatively a weight average molecular weight of from about 50,000 g/mole to about 80,000 g/mole, alternatively a weight average molecular weight of from about 50,000 g/mole to about 70,000 g/mole, alternatively a weight average molecular weight of from about 50,000 g/mole to about 60,000 g/mole. In some embodiments, the organosiloxane block copolymers of the embodiments described herein have a number average molecular weight ($M_n$) of from about 15,000 to about 50,000 g/mole; from about 15,000 to about 30,000 g/mole; from about 20,000 to about 30,000 g/mole; or from about 20,000 to about 25,000 g/mole. The average molecular weight may be readily determined using Gel Permeation Chromatography (GPC) techniques, such as those described in the Examples.

In some embodiments, the structural ordering of the disiloxy and trisiloxy units may be further described as follows: the disiloxy units $[R^1{}_2SiO_{2/2}]$ are arranged in linear blocks having an average of from 10 to 400 disiloxy units $[R^1{}_2SiO_{2/2}]$ per linear block, and the trisiloxy units $[R^2SiO_{3/2}]$ are arranged in non-linear blocks having a molecular weight of at least 500 g/mole. Each linear block is linked to at least one non-linear block in the block copolymer. Furthermore, at least 30% of the non-linear blocks are crosslinked with each other, alternatively at least at 40% of the non-linear blocks are crosslinked with each other, alternatively at least at 50% of the non-linear blocks are crosslinked with each other.

In other embodiments, from about 30% to about 80% of the non-linear blocks are crosslinked with each other; from about 30% to about 70% of the non-linear blocks are crosslinked with each other; from about 30% to about 60% of the non-linear blocks are crosslinked with each other; from about 30% to about 50% of the non-linear blocks are crosslinked with each other; from about 30% to about 40% of the non-linear blocks are crosslinked with each other; from about 40% to about 80% of the non-linear blocks are crosslinked with each other; from about 40% to about 70% of the non-linear blocks are crosslinked with each other; from about 40% to about 60% of the non-linear blocks are crosslinked with each other; from about 40% to about 50% of the non-linear blocks are crosslinked with each other; from about 50% to about 80% of the non-linear blocks are crosslinked with each other; from about 50% to about 70% of the non-linear blocks are crosslinked with each other; from about 50% to about 60% of the non-linear blocks are crosslinked with each other; from about 60% to about 80% of the non-linear blocks are crosslinked with each other; or from about 60% to about 70% of the non-linear blocks are crosslinked with each other.

The crosslinking of the non-linear blocks may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin during the preparation of the block copolymer. The free resin component may crosslink with the non-linear blocks by condensation of the residual silanol groups present on the non-blocks and on the free resin. The free resin may provide crosslinking by reacting with lower molecular weight compounds added as crosslinkers, as described herein. The free resin, when present, may be present in an amount of from about 10% to about 20% by weight of the organosiloxane block copolymers of the embodiments described herein, e.g., from about 15% to about 20% by weight organosiloxane block copolymers of the embodiments described herein.

Alternatively, certain compounds may be added during the preparation of the block copolymer to specifically crosslink the non-resin blocks. These crosslinking compounds may include an organosilane having the formula $R^5_q SiX_{4-q}$, which is added during the formation of the block copolymer (step II) as discussed herein), where $R^5$ is a $C_1$ to $C_8$ hydrocarbyl or a $C_1$ to $C_8$ halogen-substituted hydrocarbyl; X is a hydrolyzable group; and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be an oximo, acetoxy, halogen atom, hydroxyl (OH), or an alkoxy group.

In one embodiment, the organosilane having the formula $R^5_q SiX_{4-q}$ is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.).

Other suitable, non-limiting organosilanes useful as crosslinkers include; methyl tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, and methyl tris(methylmethylketoxime)silane.

In some embodiments, the crosslinks within the block copolymer will primarily be siloxane bonds, ≡Si—O—Si≡, resulting from the condensation of silanol groups, as discussed herein.

The amount of crosslinking in the block copolymer may be estimated by determining the average molecular weight of the block copolymer, such as with GPC techniques. In some embodiments, crosslinking the block copolymer increases its average molecular weight. Thus, an estimation of the extent of crosslinking may be made, given the average molecular weight of the block copolymer, the selection of the linear siloxy component (that is the chain length as indicated by its degree of polymerization), and the molecular weight of the non-linear block (which is primarily controlled by the selection of the selection of the organosiloxane resin used to prepare the block copolymer).

The present disclosure further provides curable compositions comprising:

a) the organosiloxane block copolymers as described herein, in some embodiments in combination with a stabilizer or a superbase (as described herein), and b) an organic solvent.

See, e.g., PCT Appl. No. PCT/US2012/067334, filed Nov. 30, 2012; U.S. Provisional Appl. No. 61/566,031, filed Dec. 2, 2011; PCT Appl. No. PCT/US2012/069701, filed Dec. 14, 2012; and U.S. Provisional Appl. No. 61/570,477, filed Dec. 14, 2012, the entireties of all of which are incorporated by reference as if fully set forth herein.

In some embodiments, the organic solvent is an aromatic solvent, such as benzene, toluene, or xylene.

In one embodiment, the curable compositions may further contain an organosiloxane resin (e.g., free resin that is not part of the block copolymer). The organosiloxane resin present in these compositions is, in some embodiments, the same organosiloxane resin used to prepare the organosiloxane block copolymer. Thus, the organosiloxane resin may comprise at least 60 mole % of $[R^2 SiO_{3/2}]$ siloxy units in its formula (e.g., at least 70 mole % of $[R^2 SiO_{3/2}]$ siloxy units or at least 80 mole % of $[R^2 SiO_{3/2}]$ siloxy units; or 60-70 mole % $[R^2 SiO_{3/2}]$ siloxy units, 60-80 mole % $[R^2 SiO_{3/2}]$ siloxy units or 70-80 mole % $[R^2 SiO_{3/2}]$ siloxy units), wherein each $R^2$ is independently a $C_1$ to $C_{20}$ hydrocarbyl. Alternatively, the organosiloxane resin is a silsesquioxane resin, or alternatively a phenyl silsesquioxane resin.

The amount of the organosiloxane block copolymers, organic solvent, and optional organosiloxane resin in the present curable composition may vary. The curable composition of the present disclosure may contain:

40 to 80 weight % of the organosiloxane block copolymer as described herein (e.g., 40 to 70 weight %, 40 to 60 weight %, 40 to 50 weight %); 10 to 80 weight % of the organic solvent (e.g., 10 to 70 weight %, 10 to 60 weight %, 10 to 50 weight %, 10 to 40 weight %, 10 to 30 weight %, 10 to 20 weight %, 20 to 80 weight %, 30 to 80 weight %, 40 to 80 weight %, 50 to 80 weight %, 60 to 80 weight %, or 70 to 80 weight); and 5 to 40 weight % of the organosiloxane resin (e.g., 5 to 30 weight %, 5 to 20 weight %, 5 to 10 weight %, 10 to 40 weight %, 10 to 30 weight %, 10 to 20 weight %, 20 to 40 weight % or 30 to 40 weight %);

such that the sum of the weight % of these components does not exceed 100%. In one embodiment, the curable compositions consist essentially of the organosiloxane block copolymer as described herein, the organic solvent, and the organosiloxane resin. In some embodiments, the weight % of these components sum to 100%, or nearly 100%.

In some embodiments comprises curable compositions, may contain a cure catalyst. The cure catalyst may be selected from any catalyst known in the art to effect condensation cure of organosiloxanes, such as various tin or titanium catalysts. Condensation catalyst can be any condensation catalyst that may be used to promote condensation of silicon bonded hydroxy (=silanol) groups to form Si—O—Si linkages. Examples include, but are not limited to, amines and complexes of lead, tin, titanium, zinc, and iron. Other examples include, but are not limited to basic compounds, such as trimethylbenzylammonium hydroxide, tetramethylammonium hydroxide, n-hexylamine, tributylamine, diazabicycloundecene (DBU) and dicyandiamide; and metal-containing compounds such as tetraisopropyl titanate, tetrabutyl titanate, titanium acetylacetonate, aluminum triisobutoxide, aluminum triisopropoxide, zirconium tetra(acetylacetonato), zirconium tetrabutylate, cobalt octylate, cobalt acetylacetonato, iron acetylacetonato, tin acetylacetonato, dibutyltin octylate, dibutyltin laurate, zinc octylate, zinc bezoate, zinc p-tert-butylbenzo ate, zinc laurate, zinc stearate, aluminium phosphate, and alminium triisopropoxide; organic titanium chelates such as aluminium trisacetylacetonate, aluminium bisethylacetoacetate monoacetylacetonate, diisopropoxybis (ethylacetoacetate)titanium, and diisopropoxybis(ethylacetoacetate)titanium. In some embodiments, the condensation catalysts include zinc octylate, zinc bezoate, zinc p-tert-butylbenzo ate, zinc laurate, zinc stearate, aluminium phosphate, and aluminum triisopropoxide. See, e.g., U.S. Pat. No. 8,193,269, the entire disclosure of which is incorporated by reference as if fully set forth herein. Other examples of condensation catalysts include, but are not limited to aluminum alkoxides, antimony alkoxides, barium alkoxides, boron alkoxides, calcium alkoxides, cerium alkoxides, erbium alkoxides, gallium alkoxides, silicon alkoxides, germanium alkoxides, hafnium alkoxides, indium alkoxides, iron alkoxides, lanthanum alkoxides, magnesium alkoxides, neodymium alkoxides, samarium alkoxides, strontium alkoxides, tantalum alkoxides, titanium alkoxides, tin alkoxides, vanadium alkoxide oxides, yttrium alkoxides, zinc alkoxides, zirconium alkoxides, titanium or zirconium compounds, especially titanium and zirconium alkoxides, and chelates and oligo- and polycondensates of the above alkoxides, dialkyltin diacetate, tin(II) octoate, dialkyltin diacylate, dialkyltin oxide and double metal alkoxides. Double metal alkoxides are alkoxides containing two different metals in a particular ratio. In some embodiments, the condensation catalysts include titanium tetraethylate, titanium tetrapropylate, titanium tetraisopropylate, titanium tetrabutylate, titanium tetraisooctylate, titanium isopropylate tristearoylate, titanium truisopropylate stearoylate, titanium diisopropylate distearoylate, zirconium tetrapropylate, zirconium tetraisopropylate, zirconium tetrabutylate. See, e.g., U.S. Pat. No. 7,005,460, the entire disclosure of which is incorporated by reference as if fully set forth herein. In addition, the condensation catalysts include titanates, zirconates and hafnates as described in DE 4427528 C2 and EP 0 639 622 B1, both of which are incorporated by reference as if fully set forth herein.

The organosiloxane block copolymers and curable compositions containing the organosiloxane block copolymer may be prepared by the methods as described further herein.

Solid compositions containing the resin-linear organosiloxane block copolymers may be prepared by removing the solvent from the curable organosiloxane block copolymer compositions as described herein. The solvent may be removed by any known processing techniques. In one embodiment, a film of the curable compositions containing the organosiloxane block copolymers is formed, and the solvent is allowed to evaporate from the film. Subjecting the films to elevated temperatures, and/or reduced pressures, will accelerate solvent removal and subsequent formation of the solid curable composition. Alternatively, the curable compositions may be passed through an extruder to remove solvent and provide the solid composition in the form of a ribbon or pellets. Coating operations against a release film could also be used as in slot die coating, knife over roll, rod, or gravure coating. Also, roll-to-roll coating operations could be used to prepare a solid film. In coating operations, a conveyer oven or other means of heating and evacuating the solution can be used to drive off the solvent and obtain the final solid film.

Although not wishing to be bound by any theory, it is believed that the structural ordering of the disiloxy and trisiloxy units in the organosiloxane block copolymer as described herein may provide the copolymer with certain unique physical property characteristics when solid compositions of the block copolymer are formed. For example, the structural ordering of the disiloxy and trisiloxy units in the copolymer may provide solid coatings that allow for a high optical transmittance of visible light (e.g., at wavelengths above 350 nm). The structural ordering may also allow the organosiloxane block copolymer to flow and cure upon heating, yet remain stable at room temperature. They may also be processed using lamination techniques. These properties are useful to provide coatings for various electronic articles to improve weather resistance and durability, while providing low cost and easy procedures that are energy efficient.

The present disclosure further relates to solid forms of the aforementioned organosiloxane block copolymers and solid compositions derived from the curable compositions described herein comprising the organosiloxane block copolymers.

In some embodiments, the aforementioned organosiloxane block copolymers are isolated in a solid form, for example by casting films of a solution of the block copolymer in an organic solvent (e.g., benzene, toluene, xylene or combinations thereof) and allowing the solvent to evaporate. Under these conditions, the aforementioned organosiloxane block copolymers can be provided as solutions in an organic solvent containing from about 50 wt % to about 80 wt % solids, e.g., from about 60 wt % to about 80 wt %, from about 70 wt % to about 80 wt % or from about 75 wt % to about 80 wt % solids. In some embodiments, the solvent is toluene. In some embodiments, such solutions will have a viscosity of from about 1500 cSt to about 4000 cSt at 25° C., e.g., from about 1500 cSt to about 3000 cSt, from about 2000 cSt to about 4000 cSt or from about 2000 cSt to about 3000 cSt at 25° C.

Upon drying or forming a solid, the non-linear blocks of the block copolymer further aggregate together to form "nano-domains" As used herein, "predominately aggregated" means the majority of the non-linear blocks of the organosiloxane block copolymer are found in certain regions of the solid composition, described herein as "nano-domains." As used herein, "nano-domains" refers to those phase regions within the solid block copolymer compositions that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, tubular shaped, and in some instances lamellar shaped.

In a further embodiment, the solid organosiloxane block copolymers as described herein contain a first phase and an incompatible second phase, the first phase containing predominately the disiloxy units $[R^1_2SiO_{2/2}]$ as defined herein, the second phase containing predominately the trisiloxy units $[R^2SiO_{3/2}]$ as defined herein, the non-linear blocks being sufficiently aggregated into nano-domains which are incompatible with the first phase.

When solid compositions are formed from the curable compositions of the organosiloxane block copolymer, which also contain an organosiloxane resin, as described herein, the organosiloxane resin also predominately aggregates within the nano-domains.

The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass through such a medium and not be diffracted by particles (or domains as used herein) having a size greater than 150 nanometers. As the particle size, or domains further decreases, the optical clarity may be further improved. Thus, coatings derived from the present organosiloxane copolymers may have an optical transmittance of visible light of at least 95%, e.g., at least 96%; at least 97%; at least 98%; at least 99%; or 100% transmittance of visible light. As used herein, the term "visible light" includes light with wavelengths above 350 nm.

One advantage of the present resin-linear organopolysiloxanes block copolymers is that they can be processed several times, because the processing temperature ($T_{processing}$) is less than the temperature required to finally cure ($T_{cure}$) the organosiloxane block copolymer, i.e., $T_{processing} < T_{cure}$. However the organosiloxane copolymer will cure and achieve high temperature stability when $T_{processing}$ is taken above $T_{cure}$. Thus, the present resin-linear organopolysiloxanes block copolymers offer a significant advantage of being "reprocessable" in conjunction with the benefits that may be associated with silicones, such as; hydrophobicity, high temperature stability, moisture/UV resistance.

In one embodiment, the solid compositions of the organosiloxane block copolymers may be considered as "melt processable." In some embodiments, the solid compositions, such as a coating formed from a film of a solution containing the organosiloxane block copolymers, exhibit fluid behavior at elevated temperatures, that is upon "melting." The "melt processable" features of the solid compositions of the organosiloxane block copolymers may be monitored by measuring the "melt flow temperature" of the solid compositions, that is when the solid composition demonstrates liquid behavior. The melt flow temperature may specifically be determined by measuring the storage modulus (G'), loss modulus (G") and tan delta (tan δ) as a function of temperature storage using commercially available instruments. For example, a commercial rheometer (such as TA Instruments' ARES-RDA with 2KSTD standard flexular pivot spring transducer, with forced convection oven) may be used to measure the storage modulus (G'), loss modulus (G") and tan delta as a function of temperature. Test specimens (e.g., 8 mm wide, 1 mm thick) may be loaded in between parallel plates and measured using small strain oscillatory rheology while ramping the temperature in a range from 25° C. to 300° C. at 2° C./min (frequency 1 Hz). The flow onset may be calculated as the inflection temperature in the G' drop (labeled FLOW), the viscosity at 120° C. is reported as a measure for melt processability and the cure onset is calculated as the onset temperature in the G' rise (labeled CURE). In some embodiments, the FLOW of the solid compositions will also correlate to the glass transition temperature of the non-linear segments (i.e., the resin component) in the organosiloxane block copolymer.

In some embodiments, the time to reach tan delta=1 from a value higher than 1 is from about 3 to about 60 minutes at 150° C., e.g., from about 3 to about 5 minutes at 150° C., from about 10 to about 15 minutes at 150° C., from about 10 to about 12 minutes at 150° C., from about 8 to about 10 minutes at 150° C. or from about 30 minutes to about 60 minutes at 150° C. In other embodiments, the tan delta=1 is from about 3 to about 60 seconds at 150° C., e.g., from about 3 to about 30 seconds at 150° C., from about 10 to about 45 seconds at 150° C., from about 5 to about 50 seconds at 150° C., from about 10 to about 30 seconds at 150° C. or from about 30 seconds to about 60 seconds at 150° C. In still other embodiments, the tan delta=1 is from about 5 to about 1200 seconds at 120° C., e.g., from about 20 to about 60 seconds at 120° C., from about 20 to about 600 seconds at 120° C., from about 60 to about 1200 seconds at 120° C., from about 5 to about 100 seconds at 120° C., from about 10 to about 60 seconds at 120° C. or from about 30 seconds to about 60 seconds at 120° C.

In a further embodiment, the solid compositions may be characterized as having a melt flow temperature ranging from 25° C. to 200° C., alternatively from 25° C. to 160° C., or alternatively from 50° C. to 160° C.

It is believed that the melt processability benefits enables the reflow of solid compositions of the organosiloxane block copolymers around device architectures at temperatures below $T_{cure}$, after an initial coating or solid is formed on the device. This feature is very beneficial to encapsulated various electronic devices.

In one embodiment, the solid compositions of the organosiloxane block copolymers may be considered as "curable." In some embodiments, the solid compositions, such as a coating formed from a film of a solution containing the organosiloxane block copolymers, may undergo further physical property changes by further curing the block copolymer. As discussed herein, the present organosiloxane block copolymers contain a certain amount of silanol groups. It is believed that the presence of these silanol groups on the block copolymer permit further reactivity, i.e., a cure mechanism. Upon curing, the physical properties of solid compositions may be further altered.

Alternatively, the "melt processability" and/or cure of the solid compositions of the organosiloxane block copolymers may be determined by rheological measurements at various temperatures.

The solid compositions containing the organosiloxane block copolymers may have a storage modulus (G') at 25° C. ranging from 0.01 MPa to 500 MPa and a loss modulus (G") ranging from 0.001 MPa to 250 MPa, alternatively a storage modulus (G') at 25° C. ranging from 0.1 MPa to 250 MPa and a loss modulus (G") ranging from 0.01 MPa to 125 MPa, alternatively a storage modulus (G') at 25° C. ranging from 0.1 MPa to 200 MPa and a loss modulus (G") ranging from 0.01 MPa to 100 MPa.

The solid compositions containing the organosiloxane block copolymers may have a storage modulus (G') at 120° C. ranging from 10 Pa to 500,000 Pa and a loss modulus (G") ranging from 10 Pa to 500,000 Pa, alternatively a storage modulus (G') at 120° C. ranging from 20 Pa to 250,000 Pa and a loss modulus (G") ranging from 20 Pa to 250,000 Pa, alternatively a storage modulus (G') at 120° C. ranging from 30 Pa to 200,000 Pa and a loss modulus (G") ranging from 30 Pa to 200,000 Pa.

The solid compositions containing the organosiloxane block copolymers may have a storage modulus (G') at 200° C. ranging from 10 Pa to 100,000 Pa and a loss modulus (G") ranging from 5 Pa to 80,000 Pa, alternatively a storage modulus (G') at 200° C. ranging from 20 Pa to 75,000 Pa and a loss modulus (G") ranging from 10 Pa to 65,000 Pa, alternatively a storage modulus (G') at 200° C. ranging from 30 Pa to 50,000 Pa and a loss modulus (G") ranging from 15 Pa to 40,000 Pa.

In some embodiments, the solid curable compositions of the embodiments included herein may be also be characterized by determining the G'/G" cross-over temperature. This "crossover" temperature indicates the onset of condensation cure for the resin-linear copolymer. It is believed that G'/G" cross-over temperatures varies with superbase content (and in particular for DBU concentration). Although not wishing to be bound by any theory, the present inventors believe this might again be related to the reduction in mobility of the resin-rich phase, where silanol groups may be present only on the resin and, around 100° C., the temperature is very close to the $T_g$ of the resin phase. This will result in significant mobility reduction. Thus, in certain embodiments, curable compositions may have a viscosity of at least 1700 Pa·s at 120° C., alternatively at least 2000 Pa·s at 120° C., alternatively at least 5000 Pa·s at 120° C., alternatively at least 10,000 Pa·s at 120° C., alternatively at least 20,000 Pa·s at 120° C. or alternatively at least 30,000 Pa·s at 120° C. In other embodiments, the curable compositions may have a viscosity of from about 1500 Pa·s at 120° C. to about 50,000 Pa·s at 120° C.; e.g., from about 1700 Pa·s at 120° C. to about 3000 Pa·s at 120° C.; about 2500 Pa·s at 120° C. to about 5000 Pa·s at 120° C.; from about 1500 Pa·s at 120° C. to about 2000 Pa·s at 120° C.; from about 1600 Pa·s at 120° C. to about 1800 Pa·s at 120° C., from about 10,000 Pa·s at 120° C. to about 40,000 Pa·s at 120° C., from about 20,000 Pa·s at 120° C. to about 40,000 Pa·s at 120° C. or from about 25,000 Pa·s at 120° C. to about 35,000 Pa·s at 120° C.

The solid compositions may be further characterized by certain physical properties such as tensile strength and % elongation at break. The present solid compositions derived from the aforementioned organosiloxane block copolymers may have an initial tensile strength greater than 1.0 MPa, alternatively greater than 1.5 MPa, or alternatively greater than 2 MPa. In some embodiments, the solid compositions may have an initial tensile strength for from 1.0 MPa to about 10 MPa, e.g., from about 1.5 MPa to about 10 MPa, from about 2 MPa to about 10 MPa, from about 5 MPa to about 10 MPa or from about 7 MPa to about 10 MPa. The present solid compositions derived from the aforementioned organosiloxane block copolymers may have an initial % elongation at break (or rupture) greater than 40%, alternatively greater than 50%, or alternatively greater than 75%. In some embodiments, the solid compositions may have a % elongation at break (or rupture) of from about 20% to about 90%, e.g., from about 25% to about 50%, from about 20% to about 60%, from about 40% to about 60%, from about 40% to about 50%, or from about 75% to about 90%. As used herein, tensile strength and % elongation at break are measured according to ASTM D412.

The present disclosure further provides a process for preparing a resin-linear organosiloxane composition comprising:

I) reacting
   a) a linear organosiloxane having the formula

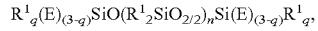

wherein each $R^1$, at each occurrence, is independently a $C_1$ to $C_{30}$ hydrocarbyl,
     n is 10 to 400, q is 0, 1, or 2,
     E is a hydrolyzable group containing at least one carbon atom, and
   b) an organosiloxane resin comprising at least 60 mole % of $[R^2SiO_{3/2}]$siloxy units in its formula, wherein each $R^2$, at each occurrence, is independently a $C_1$ to $C_{20}$ hydrocarbyl,
   in c) an organic solvent;
   to form a resin-linear organosiloxane block copolymer;
   wherein the amounts of a) and b) used in step I) are selected to provide the resin-linear organosiloxane block copolymer with 40 to 90 mole % of disiloxy units $[R^1_2SiO_{2/2}]$ and 10 to 60 mole % of trisiloxy units $[R^2SiO_{3/2}]$, and
   wherein at least 95 weight percent of the linear organosiloxane added in step I) is incorporated into the resin-linear organosiloxane block copolymer, II) reacting the resin-linear organosiloxane block copolymer from step I) to crosslink the trisiloxy units of the resin-linear organosiloxane block copolymer sufficiently to increase the weight average molecular weight ($M_w$) of the resin-linear organosiloxane block copolymer by at least 50%, wherein the crosslinking is promoted (e.g., catalyzed) by a superbase (e.g., a superbase catalyst, including an organic superbase catalyst);

III) optionally, further processing the resin-linear organosiloxane block copolymer; and IV) optionally, removing the organic solvent.

Step I) in the present process comprises:

a) a linear organosiloxane having the formula

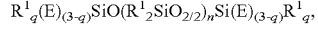

wherein each $R^1$, at each occurrence, is independently a $C_1$ to $C_{30}$ hydrocarbyl,
   n is 10 to 400, q is 0, 1, or 2,
   E is a hydrolyzable group containing at least one carbon atom, and b) an organosiloxane resin comprising at least 60 mole % of $[R^2SiO_{3/2}]$ siloxy units in its formula, wherein each $R^2$, at each occurrence, is independently a $C_1$ to $C_{20}$ hydrocarbyl, in c) an organic solvent;

to form a resin-linear organosiloxane block copolymer;

wherein the amounts of a) and b) used in step I) are selected to provide the resin-linear organosiloxane block copolymer with 40 to 90 mole % of disiloxy units $[R^1_2SiO_{2/2}]$ and 10 to 60 mole % of trisiloxy units $[R^2SiO_{3/2}]$, and wherein at least 95 weight percent of the linear organosiloxane added in step I) is incorporated into the resin-linear organosiloxane block copolymer.

The reaction of step I) of the process may be represented generally according to the following schematic:

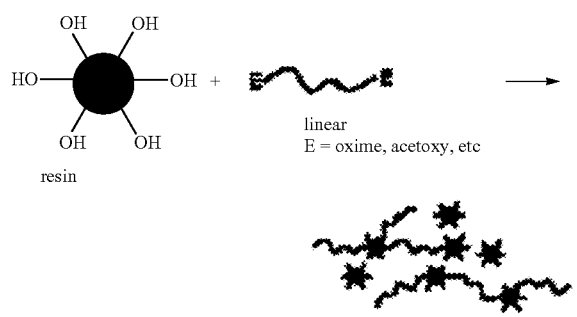

where the various OH groups on the organosiloxane resin are reacted with the hydrolyzable groups (E) on the linear organosiloxane, to form a resin-linear organosiloxane block copolymer and a H-(E) compound. The reaction in step I) may be considered as a condensation reaction between the organosiloxane resin and the linear organosiloxane.

The Linear Organosiloxane

Component a) in step I) of the present process is a linear organosiloxane having the formula $R^1_q(E)_{(3-q)}SiO(R^1_2SiO_{2/2})_nSi(E)_{(3-q)}R^1_q$, wherein each $R^1$, at each occurrence, is independently a $C_1$ to $C_{30}$ hydrocarbyl, the subscript "n" may be considered as the degree of polymerization (dp) of the linear organosiloxane and may vary from 10 to 400 (e.g., an average of from about 10 to about 400 disiloxy units; about 10 to about 200 disiloxy units; about 10 to about 100 disiloxy units; about 50 to about 400 disiloxy units; about 100 to about 400 disiloxy units; about 150 to about 400 disiloxy units; about 200 to about 400 disiloxy units; about 300 to about 400 disiloxy units; about 50 to about 300 disiloxy units; about 100 to about 300 disiloxy units; about 150 to about 300 disiloxy units; about 200 to about 300 disiloxy units; about 100 to about 150 disiloxy units, about 115 to about 125 disiloxy units, about 90 to about 170 disiloxy units or about 110 to about 140 disiloxy units), the subscript "q" may be 0, 1, or 2, and E is a hydrolyzable group containing at least one carbon atom.

While component a) is described as a linear organosiloxane having the formula $R^1_q(E)_{(3-q)}SiO(R^1_2SiO_{2/2})_nSi(E)_{(3-q)}R^1_q$, one skilled in the art recognizes small amount of alternative siloxy units, such a T [$R^1SiO_{3/2}$] siloxy units, may be incorporated into the linear organosiloxane and still be used as component a). As such, the organosiloxane may be considered as being "predominately" linear by having a majority of D [$R^1_2SiO_{2/2}$] siloxy units. Furthermore, the linear organosiloxane used as component a) may be a combination of several linear organosiloxanes. Still further, the linear organosiloxane used as component a) may comprise silanol groups. In some embodiments, the linear organosiloxane used as component a) comprises from about 0.5 to about 5 mole % silanol groups, e.g., from about 1 mole % to about 3 mole %; from about 1 mole % to about 2 mole % or from about 1 mole % to about 1.5 mole % silanol groups.

At each occurrence, each $R^1$ in the above linear organosiloxane formula is independently a $C_1$ to $C_{30}$ hydrocarbyl, where the hydrocarbyl group may independently be an alkyl, aryl, or alkylaryl group. Each $R^1$, at each occurrence, may independently be a $C_1$ to $C_{30}$ alkyl group, alternatively each $R^1$, at each occurrence, may independently be a $C_1$ to $C_{18}$ alkyl group. Alternatively, at each occurrence, each $R^1$ may independently be a $C_1$ to $C_6$ alkyl group such as methyl, ethyl, propyl, butyl, pentyl, or hexyl. Alternatively, at each occurrence, each $R^1$ may independently be methyl. Each $R^1$, at each occurrence, may independently be an aryl group, such as phenyl, naphthyl or an anthryl group. Alternatively, at each occurrence, each $R^1$ may independently be any combination of the aforementioned alkyl or aryl groups. Alternatively, at each occurrence, each $R^1$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

E may be selected from any hydrolyzable group containing at least one carbon atom. In some embodiments, E is selected from an oximo, epoxy, carboxy, amino, amido group or combinations thereof. Alternatively, E may have the formula $R^1C(=O)O—$, $R^1_2C=N—O—$, or $R^4C=N—O—$, where $R^1$ is as defined herein, and $R^4$ is hydrocarbyl. In one embodiment, E is $H_3CC(=O)O$-(acetoxy) and q is 1. In one embodiment, E is $(CH_3)(CH_3CH_2)C=N-β$-(methylethylketoximly) and q is 1.

In one embodiment, the linear organosiloxane has the formula $(CH_3)_q(E)_{(3-q)}SiO[CH_3)_2SiO_{2/2}]_nSi(E)_{(3-q)}(CH_3)_q$, where E, n, and q are as defined herein.

In one embodiment, the linear organosiloxane has the formula $(CH_3)_q(E)_{(3-q)}SiO[CH_3)(C_6H_5)SiO_{2/2}]_nSi(E)_{(3-q)}(CH_3)_q$, where E, n, and q are as defined herein.

Processes for preparing linear organosiloxanes suitable as component a) are known. In some embodiments, a silanol terminated polydiorganosiloxane is reacted with an "endblocking" compound such as an alkyltriacetoxysilane or a dialkylketoxime. The stoichiometry of the endblocking reaction may be adjusted such that a sufficient amount of the endblocking compound is added to react with all the silanol groups on the polydiorganosiloxane. In some embodiments, a mole of the endblocking compound is used per mole of silanol on the polydiorganosiloxane. Alternatively, a slight molar excess such as 1 to 10% of the endblocking compound may be used. The reaction may be conducted under anhydrous conditions to minimize condensation reactions of the silanol polydiorganosiloxane. In some embodiments, the silanol ended polydiorganosiloxane and the endblocking compound are dissolved in an organic solvent under anhydrous conditions, and allowed to react at room temperature, or at elevated temperatures (up to the boiling point of the solvent).

The Organosiloxane Resin

Component b) in the present process is an organosiloxane resin comprising at least 60 mole % of [$R^2SiO_{3/2}$] siloxy units in its formula, wherein each $R^2$ is independently a $C_1$ to $C_{20}$ hydrocarbyl. The organosiloxane resin may contain any amount and combination of other M, D, and Q siloxy units, provided the organosiloxane resin contains at least 70 mole % of [$R^2SiO_{3/2}$] siloxy units, alternatively the organosiloxane resin contains at least 80 mole % of [$R^2SiO_{3/2}$] siloxy units, alternatively the organosiloxane resin contains at least 90 mole % of [$R^2SiO_{3/2}$] siloxy units, or alternatively the organosiloxane resin contains at least 95 mole % of [$R^2SiO_{3/2}$] siloxy units. In some embodiments, the organosiloxane resin contains from about 70 to about 100 mole % of [$R^2SiO_{3/2}$] siloxy units, e.g., from about 70 to about 95 mole % of [$R^2SiO_{3/2}$] siloxy units, from about 80 to about 95 mole % of [$R^2SiO_{3/2}$] siloxy units or from about 90 to about 95 mole % of [$R^2SiO_{3/2}$] siloxy units. Organosiloxane resins useful as component b) include those known as "silsesquioxane" resins.

At each occurrence, each $R^2$ is independently a $C_1$ to $C_{20}$ hydrocarbyl (e.g., $C_1$ to $C_{10}$ hydrocarbyl), where the hydrocarbyl group may independently be an alkyl, aryl, or alkylaryl group. Each $R^2$, at each occurrence, may independently be a $C_1$ to $C_{20}$ (e.g., $C_1$ to $C_{10}$ hydrocarbyl) alkyl group, alternatively each $R^2$, at each occurrence, may independently be a $C_1$ to $C_8$ alkyl group. Alternatively, at each occurrence, each $R^2$ may independently be a $C_1$ to $C_6$ alkyl group such as methyl, ethyl, propyl, butyl, pentyl, or hexyl. Alternatively, at each occurrence, each $R^2$ may independently be methyl. Each $R^2$, at each occurrence, may independently be an aryl group, such as phenyl, naphthyl or an anthryl group. Alternatively, at each occurrence, each $R^2$ may independently be any combination of the aforementioned alkyl or aryl groups. Alternatively, at each occurrence, each $R^2$ may independently be phenyl or methyl, such that, in some embodiments, each disiloxy unit may have two alkyl groups (e.g., two methyl groups); two aryl groups (e.g., two phenyl groups); or an alkyl (e.g., methyl) and an aryl group (e.g., phenyl).

The weight average molecular weight ($M_w$) of the organosiloxane resin is not limiting, but, in some embodiments, ranges from 1000 to 10000, or alternatively 1500 to 5000 g/mole.

One skilled in the art recognizes that organosiloxane resins containing such high amounts of $[R^2SiO_{3/2}]$ siloxy units will inherently have a certain concentration of Si—OZ where Z may be hydrogen (i.e., silanol), an alkyl group (so that OZ is an alkoxy group), or alternatively OZ may also be any of the "E" hydrolyzable groups as described herein. The Si—OZ content as a mole percentage of all siloxy groups present on the organosiloxane resin may be readily determined by $^{29}$Si NMR. The concentration of the OZ groups present on the organosiloxane resin will vary, as dependent on the mode of preparation, and subsequent treatment of the resin. In some embodiments, the silanol (Si—OH) content of organosiloxane resins suitable for use in the present process will have a silanol content of at least 5 mole %, alternatively of at least 10 mole %, alternatively 25 mole %, alternatively 40 mole %, or alternatively 50 mole %. In other embodiments, the silanol content is from about 5 mole % to about 60 mole %, e.g., from about 10 mole % to about 60 mole %, from about 25 mole % to about 60 mole %, from about 40 mole % to about 60 mole %, from about 25 mole % to about 40 mole % or from about 25 mole % to about 50 mole %.

One skilled in the art further recognizes that organosiloxane resins containing such high amounts of $[R^2SiO_{3/2}]$ siloxy units and silanol contents may also retain water molecules, especially in high humidity conditions. Thus, it is often beneficial to remove excess water present on the resin by "drying" the organosiloxane resin prior to reacting in step I). This may be achieved by dissolving the organosiloxane resin in an organic solvent, heating to reflux, and removing water by separation techniques (for example, Dean Stark trap or equivalent process).

Organosiloxane resins containing at least 60 mole % of $[R^2SiO_{3/2}]$ siloxy units, and methods for preparing them, are known in the art. They may be prepared by hydrolyzing an organosilane having three hydrolyzable groups on the silicon atom, such as a halogen or alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins useful as component b) include; Dow Corning® 217 Flake Resin, 233 Flake, 220 Flake, 249 Flake, 255 Flake, Z-6018 Flake (Dow Corning Corporation, Midland Mich.).

The amounts of a) and b) used in the reaction of step I) are selected to provide the resin-linear organosiloxane block copolymer with 40 to 90 mole % of disiloxy units $[R^1{}_2SiO_{2/2}]$ and 10 to 60 mole % of trisiloxy units $[R^2SiO_{3/2}]$. The mole % of dilsiloxy and trisiloxy units present in components a) and b) may be readily determined using $^{29}$Si NMR techniques. The starting mole % then determines the mass amounts of components a) and b) used in step I).

In some embodiments, the organosiloxane block copolymers comprise 40 to 90 mole percent disiloxy units of the formula $[R^1{}_2SiO_{2/2}]$, e.g., 50 to 90 mole percent disiloxy units of the formula $[R^1{}_2SiO_{2/2}]$; 60 to 90 mole percent disiloxy units of the formula $[R^1{}_2SiO_{2/2}]$; 65 to 90 mole percent disiloxy units of the formula $[R^1{}_2SiO_{2/2}]$; 70 to 90 mole percent disiloxy units of the formula $[R^1{}_2SiO_{2/2}]$; or 80 to 90 mole percent disiloxy units of the formula $[R^1{}_2SiO_{2/2}]$; 40 to 80 mole percent disiloxy units of the formula $[R^1{}_2SiO_{2/2}]$; 40 to 70 mole percent disiloxy units of the formula $[R^1{}_2SiO_{2/2}]$; 40 to 60 mole percent disiloxy units of the formula $[R^1{}_2SiO_{2/2}]$; 40 to 50 mole percent disiloxy units of the formula $[R^1{}_2SiO_{2/2}]$; 50 to 80 mole percent disiloxy units of the formula $[R^1{}_2SiO_{2/2}]$; 50 to 70 mole percent disiloxy units of the formula $[R^1{}_2SiO_{2/2}]$; 50 to 60 mole percent disiloxy units of the formula $[R^1{}_2SiO_{2/2}]$; 60 to 80 mole percent disiloxy units of the formula $[R^1{}_2SiO_{2/2}]$; 60 to 70 mole percent disiloxy units of the formula $[R^1{}_2SiO_{2/2}]$; or 70 to 80 mole percent disiloxy units of the formula $[R^1{}_2SiO_{2/2}]$.

In some embodiments, the organosiloxane block copolymers comprise 10 to 60 mole percent trisiloxy units of the formula $[R^2SiO_{3/2}]$, e.g., 10 to 20 mole percent trisiloxy units of the formula $[R^2SiO_{3/2}]$; 10 to 30 mole percent trisiloxy units of the formula $[R^2SiO_{3/2}]$; 10 to 35 mole percent trisiloxy units of the formula $[R^2SiO_{3/2}]$; 10 to 40 mole percent trisiloxy units of the formula $[R^2SiO_{3/2}]$; 10 to 50 mole percent trisiloxy units of the formula $[R^2SiO_{3/2}]$; 20 to 30 mole percent trisiloxy units of the formula $[R^2SiO_{3/2}]$; 20 to 35 mole percent trisiloxy units of the formula $[R^2SiO_{3/2}]$; 20 to 40 mole percent trisiloxy units of the formula $[R^2SiO_{3/2}]$; 20 to 50 mole percent trisiloxy units of the formula $[R^2SiO_{3/2}]$; 20 to 60 mole percent trisiloxy units of the formula $[R^2SiO_{3/2}]$; 30 to 40 mole percent trisiloxy units of the formula $[R^2SiO_{3/2}]$; 30 to 50 mole percent trisiloxy units of the formula $[R^2SiO_{3/2}]$; 30 to 60 mole percent trisiloxy units of the formula $[R^2SiO_{3/2}]$; 40 to 50 mole percent trisiloxy units of the formula $[R^2SiO_{3/2}]$; or 40 to 60 mole percent trisiloxy units of the formula $[R^2SiO_{3/2}]$.

The amount of components a) and b) selected, in some embodiments, ensure there is a molar excess of the silanol groups on the organosiloxane resin vs. amount of linear organosiloxane added. Thus, a sufficient amount of the organosiloxane resin should be added to potentially react with all the linear organosiloxane added in step I). As such, a molar excess of the organosiloxane resin is used. The amounts used may be determined by accounting for the moles of the organosiloxane resin used per mole of the linear organosiloxane.

As discussed herein, the reaction effected step I) is a condensation reaction between the hydrolyzable groups of linear organosiloxane with the silanol groups on the organosiloxane resin. A sufficient amount of silanol groups needs to remain on the resin component of the formed resin-linear organosiloxane copolymer to further react in step II) of the present process. In some embodiments, at least 10 mole %, alternatively at least 20 mole %, or alternatively at least 30 mole % silanol should remain on the trisiloxy units of the resin-linear organosiloxane copolymer as produced in step I) of the present process. In some embodiments, from about 10 mole % to about 60 mole %, e.g., from about 20 mole % to about 60 mole %, or from about 30 mole % to about 60 mole %, should remain on the trisiloxy units of the resin-linear organosiloxane copolymer as produced in step I) of the present process.

The reaction conditions for reacting the aforementioned (a) linear organosiloxane with the (b) organosiloxane resin are not limited. In some embodiments, reaction conditions are selected to effect a condensation type reaction between the a) linear organosiloxane and b) organosiloxane resin. In some embodiments, the (a) linear organosiloxane and the (b) organosiloxane resin are reacted at room temperature. In other embodiments, (a) and (b) are reacted at temperatures that exceed room temperature and that range up to about 50, 75, 100, or even up to 150° C. Alternatively, (a) and (b) can be reacted together at reflux of the solvent. In still other embodiments, (a) and (b) are reacted at temperatures that are below room temperature by 5, 10, or even more than 10° C. In still other embodiments (a) and (b) react for times of 1, 5, 10, 30, 60, 120, or 180 minutes, or even longer. In some embodiments, (a) and (b) are reacted under an inert atmosphere, such as nitrogen or a noble gas. Alternatively, (a) and (b) may be reacted under an atmosphere that includes some water vapor and/or oxygen. Moreover, (a) and (b) may be reacted in any size vessel and using any equipment including mixers, vortexers, stirrers, heaters, etc. In other embodiments, (a) and (b) are reacted in one or more organic solvents which may be polar or non-polar. In some embodiments, aromatic solvents such as toluene, xylene, benzene, and the like may be utilized. The amount of the organosiloxane resin dissolved in the organic solvent may vary. In some embodiments, the amount may be selected to minimize the chain extension of the linear organosiloxane or premature condensation of the organosiloxane resin.

The order of addition of components a) and b) may vary. In some embodiments, the linear organosiloxane is added to a solution of the organosiloxane resin dissolved in the organic solvent. This order of addition is believed to enhance the condensation of the hydrolyzable groups on the linear organosiloxane with the silanol groups on organosiloxane resin, while minimizing chain extension of the linear organosiloxane or pre-mature condensation of the organosiloxane resin. In other embodiments, the organosiloxane resin is added to a solution of the linear organosiloxane dissolved in the organic solvent.

The progress of the reaction in step I), and the formation of the resin-linear organosiloxane block copolymer, may be monitored by various analytical techniques, such as GPC, IR, or $^{29}$Si NMR. In some embodiments, the reaction in step I) is allowed to continue until at least 95 weight percent (e.g., at least 96%, at least 97%, at least 98%, at least 99% or 100%) of the linear organosiloxane added in step I) is incorporated into the resin-linear organosiloxane block copolymer.

In one optional embodiment of the present process, the resin-linear block copolymer of step I) is further processed to, e.g., remove by-products of the step I) reaction before proceeding to step II) of the present process. In some embodiments, the resin-linear block copolymer of step I) may be subjected to certain reaction conditions and/or additional components to, e.g., enhance the reactivity of the resin-linear organosiloxane block copolymer in subsequent step II). This further processing step may be particularly useful when E on component a) (the linear organosiloxane) is acetoxy. When the linear organosiloxane contains an acetoxy group, the by-product of the reaction in step I) will be acetic acid. Although not required, it is beneficial to remove, or at least reduce, the concentration of acetic acid in the reaction product mixture of step I) before proceeding to step II), particularly because step II) involves the addition of a base (i.e., a superbase including an organic superbase). The presence of acidic species such as acetic acid in the step I) reaction product mixture may inhibit the superbase of step II). Thus, it may be beneficial to process the step I) reaction product mixture to remove acidic species, especially acid species such as acetic acid. This optional processing step may be performed by adding water to the reaction mixture of step I), and subsequently removing (or reducing) water and acetic acid from the mixture. The formed acetic acid, and any excess water, may be removed by known separation techniques. The amount of water added in some embodiments may vary. In some embodiments, the amount of water added may be 1 to 10 weight %, is added per total solids (as based on resin-linear organosiloxane copolymer in the reaction medium).

Step II) of the present process involves further reacting the resin-linear organosiloxane block copolymer from step I) to crosslink the trisiloxy units of the resin-linear organosiloxane block copolymer to increase the molecular weight of the resin-linear organosiloxane block copolymer by at least 50%, alternatively by at least 60%, alternatively by 70%, alternatively by at least 80%, alternatively by at least 90%, or alternatively by at least 100%. In some embodiments, step II) of the present process involves further reacting the resin-linear organosiloxane block copolymer from step I) to crosslink the trisiloxy units of the resin-linear organosiloxane block copolymer to increase the molecular weight of the resin-linear organosiloxane block copolymer from about 50% to about 100%, e.g., from about 60% to about 100%, from about 70% to about 100%, from about 80% to about 100% or from about 90% to about 100%, where a 100% increase in the molecular weight of the resin-linear organosiloxane block copolymer corresponds to the doubling of the molecular weight of the resin-linear organosiloxane block copolymer.

The reaction of step II) of the process may be represented generally according to the following schematic;

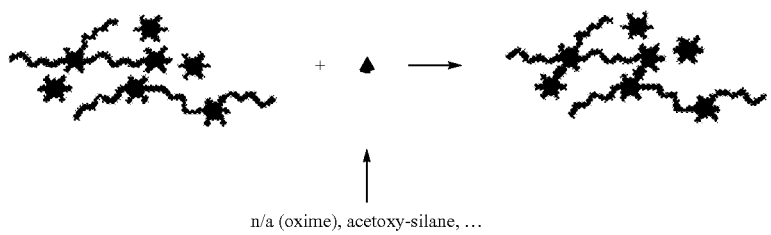

It is believed that reaction of step II) crosslinks the trisiloxy blocks of the resin-linear organosiloxane block copolymer formed in step I), which will increase the average molecular weight of the block copolymer. The inventors also believe the crosslinking of the trisiloxy blocks provides the block copolymer with an aggregated concentration of trisiloxy blocks, which ultimately may help to form "nano-domains" in solid compositions of the block copolymer. In other words, this aggregated concentration of trisiloxy blocks may phase separate when the block copolymer is isolated in a solid form such as a film or cured coating. The aggregated concentration of trisiloxy block within the block copolymer and subsequent formation of "nano-domains" in the solid compositions containing the block copolymer, may provide for enhanced optical clarity of these compositions as well as the other physical property benefits associated with these materials.

The crosslinking reaction in step II) may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin in step I) of the preparation of the block copolymer. The free resin component may crosslink with the non-linear blocks by condensation of the residual silanol groups present on the non-linear blocks and on the free resin. The free resin may provide crosslinking by reacting with lower molecular weight compounds added as crosslinkers.

In some embodiments, the crosslinking in step II) is promoted (e.g., catalyzed) by a superbase (e.g., an organic superbase catalyst). The term "superbase," as used herein, broadly refers to compounds having high basicity, such as lithium diisopropylamide. The term "superbase" also encompasses bases resulting from a mixing of two (or more) bases leading to new basic species possessing new properties. The term "superbase" does not necessarily mean a base that is thermodynamically and/or kinetically stronger than another. Instead, in some embodiments, it may mean that a basic reagent may be created by combining the characteristics of several different bases. The term "superbase" also encompasses any species with a higher absolute proton affinity (APA=245.3 kcal/mole) and intrinsic gas phase basicity (GB=239 kcal/mole) relative to 1,8-bis-(dimethylamino)-naphthalene.

Non-limiting examples of superbases include organic superbases, organometallic superbases, and inorganic superbases.

Organic superbases include, but are not limited to nitrogen-containing compounds. In some embodiments, the nitrogen-containing compounds also have low nucleophilicity and relatively mild conditions of use. Non-limiting examples of nitrogen-containing compounds include phosphazenes, amidines, guanidines, and multicyclic polyamines. Organic superbases also include compounds where a reactive metal has been exchanged for a hydrogen on a heteroatom, such as oxygen (unstabilized alkoxides) or nitrogen (metal amides such as lithium diisopropylamide). In some embodiments, the superbase is an amidine compound.

In some embodiments, the term "superbase" refers to organic superbases having at least two nitrogen atoms and a $pK_b$ of from about 0.5 to about 11, as measured in water. For example, the $pK_b$ is from about 0.5 to about 10, from about 1 to about 5, from about 6 to about 11, from about 3 to about 5, from about 0.5 to about 3 or from about 2 to about 5, as measured in water. In terms of $pK_a$, in some embodiments, superbases have a $pK_a$ of from about 3 to about 13.5, as measured in water. For example, the $pK_a$ is from about 5 to about 10, from about 5 to about 10, from about 8 to about 13.5, from about 6 to about 8, from about 10 to about 12 or from about 9 to about 12, as measured in water. For example, 1,4-diazabicyclo[2.2.2]octane, also known as DABCO, has a pKa of 2.97 and 8.82 (since it contains two nitrogens); and 1,8-diazabicyclo[5.4.0]undec-7-ene, also known as DBU, has a pKa of about 12. See, e.g., http://evans.harvard.edu/pdf/evans_pka_table.pdf.

Organometallic superbases include, but are not limited to, organolithium and organomagnesium (Grignard reagent) compounds. In some embodiments, the organometallic superbases are hindered to the extent necessary to make them non-nucleophilic.

Superbases also include mixtures of organic, organometallic, and/or inorganic superbases. A non-limited example of such mixed superbases is the Schlosser base (or Lochmann-Schlosser base), which is the combination of n-butyllithium and potassium tert-butoxide. The combination of n-butyllithium and potassium tert-butoxide form a mixed aggregate of greater reactivity than either reagent alone and with distinctly different properties in comparison to tert-butylpotassium.

Inorganic superbases include salt-like compounds with small, highly charged anions. Non-limiting examples of inorganic superbases include lithium nitride and alkali- and alkali earth metal hydrides including potassium hydride and sodium hydride. Such species are insoluble in all solvents owing to the strong cation-anion interactions, but the surfaces of these materials are highly reactive and slurries can be used.

In certain embodiments of the present invention, the superbase is an organic superbase, such as any of the organic superbases as described herein or known in the art.

In a further embodiment, the superbase comprises:
1,8-Diazabicyclo[5.4.0]undec-7-ene (DBU), (CAS #6674-22-2)
1,5,7-Triazabicyclo[4.4.0]dec-5-ene (TBD), (CAS #5807-14-7)
1,4-Diazabicyclo[2.2.2]octane (DABCO), (CAS #280-57-9)
1,1,3,3-Tetramethylguanidine (TMG), (CAS #80-70-6)
1,5-Diazabicyclo[4.3.0]-5-nonene (DBN), (CAS #3001-72-7)
7-Methyl-1,5,7-triazabicyclo[4.4.0] dec-5-ene (MTBD) (CAS #84030-20-6)
or combinations thereof.

The structures for each of these are shown below:

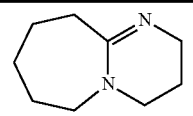
DBU

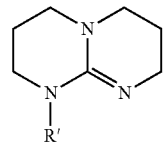
TBD (when R' = H)
MTBD (when R' = CH$_3$)

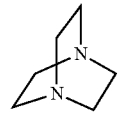
DABCO

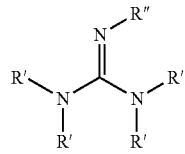
TMG (when R' = CH$_3$ and R" = H)

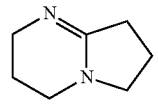
DBN

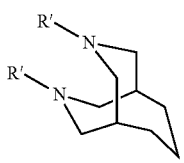
Bispidine (when R' = H)

where each R' is the same or different and is hydrogen or $C_1$-$C_5$ alkyl; and R" is hydrogen or $C_1$-$C_5$ alkyl. As used herein, the term "$C_1$-$C_5$ alkyl" refers broadly to a straight or branched chain saturated hydrocarbon radical. Examples of alkyl groups include, but are not limited to, straight chained alkyl groups including methyl, ethyl, n-propyl, n-butyl; and branched alkyl groups including isopropyl, tert-butyl, isoamyl, neopentyl, and the like. In some embodiments, the hydrocarbon radical is methyl.

The amount of the superbase used in step II) may vary and is not limiting. In some embodiments, the amount added is a catalytically effective amount, which may vary depending on the superbase selected, as well as the concentration of residual silanol groups in the linear-resin copolymer of step I), especially the amount of residual silanol groups on the resin-linear organosiloxane block copolymer and resin components, and particularly the silanol amount on the "free resin" components in the composition. The amount of superbase is, in some embodiments, measured in parts per million (ppm). In some embodiments, the superbase amount is calculated in relation to copolymer solids of the reaction mixture from step I). The amount of superbase added to the reaction mixture from step I) may range from 0.1 to 1,000 ppm, alternatively from 1 to 500 ppm, or alternatively from 10 to 100 ppm, as based on the resin-linear block copolymer content (by weight) present in the compositions. For convenience, for measuring and adding to the reaction mixture from step I), the superbase may be diluted in an organic solvent before adding to the reaction mixture. In some embodiments, the superbase is diluted in the same organic solvent as used in step I) and/or II).

In some embodiments, at least some portion of the superbase added in step I) may remain in the resin-linear organosiloxane block copolymer product and curable/solid compositions of the resin-linear block copolymer. In such instances, the superbase may substantially reside in the phase separated resin rich phase and may further enhance silanol condensation in that phase, thereby further reducing the mole % of reactive silanol groups in that phase. While not wishing to be bound by theory, it is believed that the superbase may interact very strongly with acidic Si—OH groups of the resin residing in the phase separated resin rich phase. In some embodiments, the superbase will be more likely to reside in the phase separated resin rich phase when the superbase may be more compatible (e.g., soluble) with that phase than, e.g., in the organosiloxane block copolymer-rich phase, and less likely to reside in the phase separated resin rich phase when the superbase is less compatible with phase separated resin rich phase. In some embodiments, the mole % of reactive silanol groups in the phase separated resin rich phase is reduced by about 25%, e.g., by about 35%, by about 45%, by about 55%, by about 65%, by about 75%, by about 85%, or by about 95% relative to the mole % reactive silanol groups that would be present in the phase separated resin rich phase if the superbase were not present. In some embodiments, the mole % of reactive silanol groups in the phase separated resin rich phase is reduced from about 25% to about 95%, e.g., from about 25% to about 55%, from about 25% to about 75%, from about 35% to about 75%, from about 55% to about 95% or from about 55% to about 85% relative to the mole % reactive silanol groups that would be present in the phase separated resin rich phase if the superbase were not present.

Step II) of the present process may occur simultaneous upon formation of the resin-linear organosiloxane of step I), or involve a separate reaction in which conditions have been modified to effect the step II) reaction. The step II) reaction may occur in the same conditions as step I). In this situation, the step II) reaction proceeds as the resin-linear organosiloxane copolymer is formed. Alternatively, the reaction conditions used for step I) are extended to further the step II) reaction. Alternatively, the reaction conditions may be changed, or additional ingredients added to effect the step II) reaction.

In some embodiments, the step II) reaction conditions may depend on the selection of the hydrolyzable group (E) used in the starting linear organosiloxane. When (E) in the linear organosiloxane is an oxime group, it is possible for the step II) reaction to occur under the same reaction conditions as step I. That is, as the linear-resin organosiloxane copolymer is formed in step I), it will continue to react via condensation of the silanol groups present on the resin component to further increase the molecular weight of the resin-linear organosiloxane copolymer. Not wishing to be bound by any theory, it is believed that when (E) is an oximo group, the hydrolyzed oximo group (for example, methyl ethylketoxime) resulting from the reaction in step I) may act as a condensation catalyst for the step II) reaction. As such, the step II) reaction may proceed simultaneously under the same conditions for step I). In other words, as the resin-linear organosiloxane copolymer is formed in step I), it may further react under the same reaction conditions to further increase its molecular weight via a condensation reaction of the silanol groups present on the resin component of the copolymer. However, when (E) on the linear organosiloxane is an acetoxy group, the resulting hydrolyzed group (acetic acid), does not sufficiently catalyze the step II) reaction. Thus, in this situation the step II) reaction may be enhanced with a further component to effect condensation of the resin components of the resin-linear organosiloxane copolymer.

In one embodiment of the present process, an organosilane having the formula $R^5{}_q SiX_{4-q}$ is added during step II), where $R^5$ is a $C_1$ to $C_8$ hydrocarbyl or a $C_1$ to $C_8$ halogen-substituted hydrocarbyl, X is a hydrolyzable group, and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be E, as defined herein, a halogen atom, hydroxyl (OH), or an alkoxy group. In one embodiment, the organosilane is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.). Other suitable, non-limiting organosilanes useful in some embodiments include; methyl-tris (methylethylketoxime)silane (MTO), methyl triacetoxysilane, ethyl triacetoxysilane, tetraacetoxysilane, tetraoximesilane, dimethyl diacetoxysilane, dimethyl dioximesilane, methyl tris(methylmethylketoxime) silane.

The amount of organosilane having the formula $R^5_q SiX_{4-q}$ when added during step II) varies, but, in some embodiments is based on the amount of organosiloxane resin used in the process. The amount of silane used, in some embodiments, provides a molar stoichiometry of 2 to 15 mole % of organosilane per moles of Si on the organosiloxane resin. Furthermore, the amount of the organosilane having the formula $R^5_q SiX_{4-q}$ added during step II) is controlled to ensure a stoichiometry that does not consume all the silanol groups on the organosiloxane block copolymer. In one embodiment, the amount of the organosilane added in step II) is selected to provide an organosiloxane block copolymer containing 0.5 to 35 mole percent of silanol groups [≡SiOH].

Step III) in the process is optional, and involves further processing the resin-linear organosiloxane block copolymer. Further processing includes, but is not limited to further processing the resin-linear organosiloxane block copolymer to enhance its storage stability and/or optical clarity. Thus, as used herein, the phrase "further processing" refers broadly to any further reaction or treatment of the formed resin-linear organosiloxane copolymer to, among other things, enhance its storage stability, and/or optical clarity. The resin-linear organosiloxane copolymer as produced in step II) may, for example, may still contain a significant amount of reactive "OZ" groups (that is ≡SiOZ groups, where Z is as defined herein), and/or X groups (where X is introduced into the block copolymer when the organosilane having the formula $R^5_q SiX_{4-q}$ is used in step II). The OZ groups present on the resin-linear organosiloxane copolymer at this stage may be silanol groups that were originally present on the resin component, or alternatively may result from the reaction of the organosilane having the formula $R^5_q SiX_{4-q}$ with silanol groups, when the organosilane is used in step II). It is possible that such "OZ" or X groups may further react during storage, limiting shelf stability, or diminishing reactivity of the resin-linear organosiloxane copolymer during end-use applications. Alternatively, further reaction of residual silanol groups may further enhance the formation of the resin domains and improve the optical clarity of the resin-linear organosiloxane copolymer. Thus, optional step III) may be performed to, e.g., further react OZ or X present on the organosiloxane block copolymer produced in step II) to improve storage stability and/or optical clarity. The conditions for step III) may vary, depending on the selection of the linear and resin components, their amounts, and the endcapping compounds used.

In one embodiment of the process, step III) is performed by reacting the resin-linear organosiloxane from step II) with water and removing any small molecular compounds formed in the process, such as acetic acid. In some embodiments, the resin-linear organosiloxane copolymer may be produced from a resin organosiloxane where E is an acetoxy group, and/or an acetoxy silane is used in step II). Although not wishing to be bound by any theory, it is possible that in some embodiments, the resin-linear organosiloxane formed in step II) contains a significant quantity of hydrolyzable Si—O—C(O)CH$_3$ groups, which may limit the storage stability of the resin-linear organosiloxane copolymer. Thus, water may be added to the resin-linear organosiloxane copolymer formed from step II), which may hydrolyze a substantial amount of Si—O—C(O)CH$_3$ groups to further link the trisiloxy units, and eliminate acetic acid. The formed acetic acid, and any excess water, may be removed by known separation techniques. The amount of water added in some embodiments may vary. In some embodiments, the amount of water added may be 10 weight %, or alternatively 5 weight % is added per total solids (as based on resin-linear organosiloxane copolymer in the reaction medium).

In one embodiment of the process, step III) is performed by reacting the resin-linear organosiloxane from step II) with an endcapping compound, including endcapping compounds selected from an alcohol, oxime, or trialkylsiloxy compound. In some embodiments, the resin-linear organosiloxane copolymer may be produced from a linear organosiloxane where E is an oxime group. The endcapping compound may be a $C_1$-$C_{20}$ alcohol (e.g., $C_1$-$C_{20}$ alcohol, $C_1$-$C_{12}$ alcohol, $C_1$-$C_{10}$ alcohol, $C_1$-$C_6$ alcohol or $C_1$-$C_4$ alcohol) such as methanol, ethanol, propanol, butanol, or others in the series. Alternatively, the alcohol is n-butanol. The endcapping compound may also be a trialkylsiloxy compound, such as trimethylmethoxysilane or trimethylethoxysilane. The amount of endcapping compound may vary. In some embodiments, the amount of endcapping compound added may be between 3 and 15 wt % (e.g., 3 to 10 wt %, 5 to 15 wt %, 3 to 5 wt %, 10 to 15 wt %, 5 to 10 wt %, or 3 to 12 wt %) with respect to the resin linear organosiloxane block copolymer solids in the reaction medium.

Optional step III) in the process may, in addition to, or in place of "further processing," involve contacting the resin-linear organosiloxane block copolymer from step II) with a superb ase that is the same or different than the superbase used in step II) and/or a stabilizer. See, e.g., PCT Appl. No. PCT/US2012/067334, filed Nov. 30, 2012; U.S. Provisional Appl. No. 61/566,031, filed Dec. 2, 2011; PCT Appl. No. PCT/US2012/069701, filed Dec. 14, 2012; and U.S. Provisional Appl. No. 61/570,477, filed Dec. 14, 2012, the entireties of all of which are incorporated by reference as if fully set forth herein.

In one embodiment, step III) is performed by contacting the reaction mixture from step II) with a solid adsorbent and subsequently separating the solid adsorbent. In some embodiments, any residual organic superbase may be removed (or its concentration reduced) in the resin-linear organosiloxane block copolymer compositions. In some embodiments, this process may be performed by filtering the reaction mixture from step II) through the solid adsorbent. Any solid adsorbent, especially known for removing basic organic compounds may be used as the solid adsorbent. In some embodiments, the solid adsorbent may be alumina, e.g., acidic alumina. In other embodiments, the solid adsorbent may be silica gel.

In some embodiments, residual organic superbase may be removed (or its concentration reduced) in the resin-linear organosiloxane block copolymer compositions by treating the compositions with an organic acid (e.g., acetic acid) so as to form the salt of the organic superbase. The salt of the organic superbase can then be removed, e.g., by filtration or by aqueous extraction. In other embodiments, residual organic superbase may be removed (or its concentration reduced) in the resin-linear organosiloxane block copolymer compositions by exposing the composition to vacuum, particularly in situations where the organic superbase is volatile (e.g., DBU boils at 80° C.). To assist in the removal of the organic superbase, heat may be applied to the composition while it is under vacuum.

Step IV) of the present process is optional, and involves removing the organic solvent used in the reactions of steps I) and II). The organic solvent may be removed by any known techniques. In some embodiments, removal of the organic solvent involves heating the resin-linear organosiloxane copolymer compositions at elevated temperature, either at atmospheric conditions or under reduced pressures. In some embodiments, not all of the solvent is removed. In some embodiments, at least 20%, at least 30%, at least 40%, or at least 50% of the solvent is removed, e.g., at least 60%, at least 70%, at least 75%, at least 80% or at least 90% of the solvent is removed. In some embodiments, less than 20% of the solvent is removed, e.g., less than 15%, less than 10%, less than 5% or 0% of the solvent is removed. In other embodiments, from about 20% to about 100% of the solvent is removed, e.g., from about 30% to about 90%, from about 20% to about 80%, from about 30 to about 60%, from about 50 to about 60%, from about 70 to about 80% or from about 50% to about 90% of the solvent is removed.

The present disclosure further provides a method of improving at least one of the following properties: cure (e.g., rate and extent), tensile strength, or thermal stability, of a solid curable film composition of a resin linear organopolysiloxane of the embodiments described herein by adding superbase, e.g., to crosslink the trisiloxy units of the resin-linear organosiloxane block copolymer. The solid curable film compositions of a resin-linear organopolysiloxane of the embodiments described herein and the superbase are the same as defined herein.

The improvements in cure properties may be characterized by the reduction in cure temperatures necessary to initiate final cure of the present compositions. In some embodiments, this may be assessed by determining the G'/G" cross-over temperature from the rheological assessment, as discussed herein. The addition of a superbase to crosslink the trisiloxy units of the resin-linear organosiloxane block copolymer may cause the cure temperature to be reduced from a temperature that, in some embodiments, ranges from 120 to 250° C. without to a temperature range of 60° C. to 150° C. In one embodiment, the temperature needed to cure the present curable composition is reduced by 10%, alternatively 20%, or alternatively 50% by the addition of a superbase vs. comparable compositions that do not utilize a superbase to crosslink the trisiloxy units of the resin-linear organosiloxane block copolymer. In other embodiments, the curable compositions of the embodiments described herein have a cure temperature that is about 10% to about 50% lower; e.g., from about 20% to about 50% lower; from about 10% to about 20% lower; from about 25% to about 50% lower; or from about 15 to about 30% lower than the cure temperature of comparable compositions that do not utilize a superbase to crosslink the trisiloxy units of the resin-linear organosiloxane block copolymer.

The improvement in tensile strength may be characterized by at least a 50% increase, alternatively at least a 75%, or alternatively at least 100% increase in tensile strength for those compositions containing the superbase versus those that do not utilize a superbase to crosslink the trisiloxy units of the resin-linear organosiloxane block copolymer. In some embodiments, the improvement in tensile strength may be from about 50% to about 100% increase in tensile strength, e.g., from about 50% to about 75%, from about 60% to about 90%, about 60% to about 100% or from about 75% to about 100% increase in tensile strength.

The improvement in thermal stability may be characterized either qualitatively or quantitatively. For example, the improvements in thermal stability may be assessed qualitatively by visually assessing the change in color of the heat aged cured films (for example color assessment after aging 100 hours at 250° C.). Films prepared from the present curable compositions containing the superbase may have less color than comparable compositions without the superbase. In some embodiments, the films prepared from the curable compositions containing a superbase have an optical transmittance of visible light of at least 95%, e.g., at least 96%; at least 97%; at least 98%; at least 99%; or 100% transmittance of visible light. As used herein, the term "visible light" includes light with wavelengths above 350 nm. Alternatively, thermal stability may be assessed quantitatively by techniques such as by determining the temperature ($T_d$) at which a 5 wt % loss occurs during heating at 5° C./min. (see Examples for more details).

Some of the embodiments of the present invention relate to optical assemblies and articles comprising the compositions described herein such as those described in PCT/US2012/071011, filed Dec. 20, 2012; PCT/US2013/021707, filed Jan. 16, 2013; and PCT/US2013/025126, filed Feb. 7, 2013, all of which are incorporated by reference as if fully set forth herein. Accordingly, some embodiments of the present invention relate to an LED encapsulant comprising an organosiloxane block copolymer described herein.

The term "about," as used herein, can allow for a degree of variability in a value or range, for example, within 10%, within 5%, or within 1% of a stated value or of a stated limit of a range.

Values expressed in a range format should be interpreted in a flexible manner to include not only the numerical values explicitly recited as the limits of the range, but also to include all the individual numerical values or sub-ranges encompassed within that range as if each numerical value and sub-range were explicitly recited. For example, a range of "about 0.1% to about 5%" or "about 0.1% to 5%" should be interpreted to include not just about 0.1% to about 5%, but also the individual values (e.g., 1%, 2%, 3%, and 4%) and the sub-ranges (e.g., 0.1% to 0.5%, 1.1% to 2.2%, 3.3% to 4.4%) within the indicated range.

Embodiments of the invention described and claimed herein are not to be limited in scope by the specific embodiments herein disclosed, since these embodiments are intended as illustration of several aspects of the disclosure. Any equivalent embodiments are intended to be within the scope of this disclosure. Indeed, various modifications of the embodiments in addition to those shown and described herein will become apparent to those skilled in the art from the foregoing description. Such modifications are also intended to fall within the scope of the appended claims.

The Abstract is provided to allow the reader to quickly ascertain the nature of the technical disclosure. It is submitted with the understanding that it will not be used to interpret or limit the scope or meaning of the claims.

EXAMPLES

The following examples are included to demonstrate specific embodiments of the invention. However, those of skill in the art should, in light of the present disclosure, appreciate that many changes can be made in the specific embodiments which are disclosed and still obtain a like or similar result without departing from the spirit and scope of the invention. All percentages are in wt %. All measurements were conducted at 23° C. unless indicated otherwise.

Characterization Techniques $^{29}$Si and $^{13}$C NMR Spectrometry

NMR samples of resin linear products were prepared by weighing ~3 grams of solvent free resin linear (prepared by drying sample overnight at room temperature), 1 g of $CDCl_3$, and 4 grams of 0.04 M $Cr(acac)_3$ solution in $CDCl_3$ into a vial and mixing thoroughly Samples were then transferred into a silicon-free NMR tube. Spectra were acquired using a Varian Mercury 400 MHz NMR. NMR samples of other materials such as 217 Flake may be prepared by diluting 4 g of sample into 4 grams of 0.04 M $Cr(acac)_3$ solution in $CDCl_3$.

$^{13}$C NMR experiments were performed in the following manner. Samples were placed into 16 mm glass NMR tubes.

A 5 mm NMR tube was placed inside the 16 mm tube and filled with lock solvent. $^{13}$C DEPT NMR was acquired in 12 or 20 minute signal averaging blocks. Data was acquired on a Varian Inova NMR spectrometer with a 1H operational frequency of 400 MHz.

Silanol content of resin linear products was calculated from the integration values of the T(Ph,OZ) and T(Ph,OZ$_2$) regions in the $^{29}$Si NMR spectrum. T(Alkyl) groups were considered fully condensed (assumption) and subtracted from the T(Ph,OZ) region. The T(Alkyl) content was calculated by multiplying the integration value of D(Me$_2$) from $^{29}$Si NMR by the fraction (moles Si of coupling agent/moles Si of PDMS used in the synthesis formulation). Isopropoxy from 217 Flake was not subtracted out of the OZ values due to its low concentration. Therefore it was assumed that total OZ=total OH.

GPC Analysis

Samples were prepared in certified THF at 0.5% w/v concentration, filtered with a 0.45 µm PTFE syringe filter, and analyzed against polystyrene standards. The relative calibration (3rd order fit) used for molecular weight determination was based on 16 polystyrene standards ranging in molecular weights from 580 to 2,320,000 Daltons. The chromatographic equipment consisted of a Waters 2695 Separations Module equipped with a vacuum degasser, a Waters 2410 differential refractometer and two (300 mm×7.5 mm) Polymer Laboratories Mixed C columns (molecular weight separation range of 200 to 3,000,000) preceded by a guard column. The separation was performed using certified grade THF programmed to flow at 1.0 mL/min., injection volume was set at 100 µL and columns and detector were heated to 35° C. Data collection was 25 minutes and processing was performed using Atlas/Cirrus software.

To determine free resin content, the free resin peak at lower molecular weight was integrated to get the area percent.

Rheology Analysis

A commercially available rheometer from TA Instruments (ARES-RDA with 2KSTD standard flexural pivot spring transducer, TA Instruments, New Castle, Del. 19720) with forced convection oven was used to measure the storage modulus (G'), loss modulus (G") and tan delta as a function of temperature. Test specimens (e.g., 8 mm wide, 1 mm thick) were loaded in between parallel plates and measured using small strain oscillatory rheology while ramping the temperature in a range from 25° C. to 300° C. at 2° C./min. (frequency 1 Hz).

To characterize the copolymers, the flow onset was calculated as the inflection temperature in the G' drop (labeled FLOW), the viscosity at 120° C. will be reported as a measure for melt processability and the cure onset was calculated as the inflection temperature in the G' rise (labeled CURE).

Optical Clarity

Optical clarity was evaluated as the % transmission of light at wavelengths from about 350-1000 nanometers, measured through 1 mm thick samples of cast sheets of the present compositions. Samples having a % transmittance of at least 95% were considered to be optically clear.

Example 1

Preparation of a 45 wt % Ph-T-55 wt % 130 dp PhMe siloxane

A 500 mL 4-neck round bottom flask was loaded with toluene (44.46 g) and 217 flake resin (54.0 g, 0.395 moles Si). The flask was equipped with a thermometer, teflon stir paddle, and a Dean Stark apparatus attached to a water-cooled condenser. A nitrogen blanket was applied. The Dean Stark apparatus was prefilled with toluene. A heating mantle was used for heating.

The reaction mixture was heated at reflux for 30 minutes, during which 0.32 mL of water was removed. The reaction mixture was cooled to 108° C.

A solution of silanol terminated PhMe siloxane (101.54 g solution in toluene=66.00 g siloxane, 0.484 moles Si) was capped with 50/50 MTA/ETA (1.29 g, 0.00569 moles Si). The silanol terminated PhMe siloxane was prepared in a glove box (same day) under nitrogen by adding 50/50 MTA/ETA to the siloxane and mixing at room temperature for 1 hour.

The polymer solution was added to the 217 flake solution quickly at 108° C. The reaction mixture was heated at reflux for 2 hours, over which 0.78 mL of water was removed.

The reaction mixture was allowed to cool to 90° C. Deionized (DI) water was added (7 mL). The reaction mixture was heated to reflux and removed water via azeotropic distillation over 30 minutes. Distilled off toluene (25.7 g) to increase the solids content to ~70%. An aliquot from the reaction mixture was examined using IR analysis. IR analysis showed no acetic acid carbonyl present.

The reaction mixture was treated with a DBU solution (1.18 g) in toluene (DBU concentration in reaction mixture: 50 ppm (solids basis)). The reaction mixture was heated at reflux (pot temperature: 118° C.) for 40 minutes. The heating was stopped after 40 minutes due to high viscosity. Water formation: 15 minutes-1.35 mL; 30 minutes-1.55 mL; 40 minutes-1.60 mL.

The reaction mixture was cooled to room temperature. The solution turned very hazy. The reaction mixture was treated with alumina. The reaction mixture was then pressure filtered the following day using a 0.5 µm filter. The filtrate was clear.

$^{29}$Si NMR analysis confirmed the formula of the resin linear organosiloxane copolymer to be $M^{PhMe2}_{0.003}D^{PhMe}_{0.552}T^{Ph}_{0.433}$ with an OZ content of =6.30 mole %.

The resulting non-volatile containing (NVC) samples were transparent. No haze was visible when immediately removed from the oven. The resulting films (~0.8 mm thick) were also transparent. RI measured at 633 nm on a film from this example was 1.560.

What is claimed is:

1. A process for preparing a resin-linear organosiloxane block copolymer comprising:

I) reacting a) a linear organosiloxane having the formula

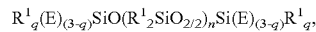

wherein each $R^1$, at each occurrence, is independently a $C_1$ to $C_{30}$ hydrocarbyl, n is 10 to 400, q is 0, 1, or 2, E is a hydrolyzable group containing at least one carbon atom, and b) an organosiloxane resin comprising at least 60 mole % of [$R^2SiO_{3/2}$] siloxy units in its formula, wherein each $R^2$ is independently a $C_1$ to $C_{20}$ hydrocarbyl, in c) an organic solvent to form a resin-linear organosiloxane block copolymer;

wherein the amounts of a) and b) used in step I) are selected to provide the resin-linear organosiloxane block copolymer with 40 to 90 mole % of disiloxy units [$R^1_2SiO_{2/2}$] and 10 to 60 mol % of trisiloxy units [$R^2SiO_{3/2}$], and wherein at least 95 weight percent of the linear organosiloxane added in step I) is incorporated into the resin-linear organosiloxane block copolymer, II) reacting the resin-linear organosiloxane block copolymer from step I) to crosslink the trisiloxy units of the resin-linear organosiloxane block copolymer sufficiently to increase the weight average molecular weight ($M_w$) of the resin-linear organosiloxane block copolymer by at least 50%,
wherein the crosslinking reaction is promoted by a superbase, III) optionally, further processing the resin-linear organosiloxane block copolymer; and IV) optionally, removing the organic solvent.

2. The process of claim 1, wherein said further processing comprises further processing to enhance storage stability and/or optical clarity.

3. The process of claim 1, wherein E is acetoxy and q=1.

4. The process of any-preceding claim 1, wherein the resin-linear block copolymer of step I) is further processed.

5. The process of claim 1, wherein said further processing comprises removing a by-product of the step I) reaction.

6. The process of claim 5, wherein the by-product comprises acetic acid.

7. The process of claim 1, wherein said crosslinking reaction is catalyzed by a superbase.

8. The process of claim 1, wherein the superbase is an organic superbase.

9. The process of claim 1, wherein the superbase comprises:

1,8-Diazabicyclo[5.4.0]undec-7-ene (DBU), (CAS #6674-22-2)

1,5,7-Triazabicyclo[4.4.0]dec-5-ene (TBD), (CAS #5807-14-7)

1,4-Diazabicyclo[2.2.2]octane (DABCO), (CAS #280-57-9)

1,1,3,3-Tetramethylguanidine (TMG), (CAS #80-70-6)

1,5-Diazabicyclo[4.3.0]-5-nonene (DBN), (CAS #3001-72-7)

7-Methyl-1,5,7-triazabicyclo[4.4.0]dec-5-ene (MTBD) (CAS #84030-20-6)

or combinations thereof.

10. The process of claim 1, wherein the superbase is 1,8-diazabicyclo[5.4.0]undec-7-ene (DBU), (CAS #6674-22-2).

11. The process of any-preceding claim 1, wherein $R^1$ is methyl or phenyl.

12. The process of claim 1, wherein $R^2$ is methyl or phenyl.

13. The process of claim 1, wherein $R^2$ is phenyl.

14. The process of claim 1, wherein instead of or in addition to said further processing, the organosiloxane block copolymer from step II) is contacted with a stabiliser or a superbase.

15. A resin-linear organosiloxane block copolymer prepared according to claim 1.

16. The resin-linear organosiloxane block copolymer of claim 15, wherein said resin-linear organosiloxane block copolymer comprises:

40 to 90 mole percent disiloxy units of the formula $[R^1_2SiO_{2/2}]$, 10 to 60 mole percent trisiloxy units of the formula $[R^2SiO_{3/2}]$, 0.5 to 35 mole percent silanol groups [≡SiOH];

wherein:

each $R^1$, at each occurrence, is independently a $C_1$ to $C_{30}$ hydrocarbyl, each $R^2$, at each occurrence, is independently a $C_1$ to $C_{20}$ hydrocarbyl;

wherein:

the disiloxy units $[R^1_2SiO_{2/2}]$ are arranged in linear blocks having an average of from 10 to 400 disiloxy units $[R^1_2SiO_{2/2}]$ per linear block, the trisiloxy units $[R^2SiO_{3/2}]$ are arranged in non-linear blocks having a molecular weight of at least 500 g/mole, and at least 30% of the non-linear blocks are crosslinked with each other, each linear block is linked to at least one non-linear block; and the organosiloxane block copolymer has a molecular weight of at least 20,000 g/mole.

17. A method of forming a coating comprising applying a film of the resin-linear organosiloxane block copolymer of claim 15 on a surface and curing the film to form a coating.

18. A solid composition comprising the resin-linear organosiloxane of claim 15.

19. The solid composition of claim 18, wherein the solid has an optical transmittance of visible light that is at least 95%.

20. An LED encapsulant comprising the composition of claim 18.

21. The solid composition of claim 18, further comprising a super base or a stabiliser.

22. The cured product of the composition of claim 18.

* * * * *